(12) United States Patent
Aaldenberg et al.

(10) Patent No.: US 11,112,833 B2
(45) Date of Patent: Sep. 7, 2021

(54) METHOD FOR MEASURING FRACTURE TOUGHNESS OF GLASS

(71) Applicant: CORNING INCORPORATED, Corning, NY (US)

(72) Inventors: Emily Marie Aaldenberg, Corning, NY (US); Jared Seaman Aaldenberg, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 17/179,541

(22) Filed: Feb. 19, 2021

(65) Prior Publication Data

US 2021/0181802 A1 Jun. 17, 2021

Related U.S. Application Data

(63) Continuation of application No. 16/425,217, filed on May 29, 2019.

(60) Provisional application No. 62/678,560, filed on May 31, 2018.

(51) Int. Cl.

| G06F 1/16 | (2006.01) |
|---|---|
| C03C 21/00 | (2006.01) |
| H05K 5/02 | (2006.01) |
| C03C 3/087 | (2006.01) |
| C03C 3/093 | (2006.01) |
| C03C 3/095 | (2006.01) |
| G01M 5/00 | (2006.01) |

(52) U.S. Cl.
CPC ............ *G06F 1/1656* (2013.01); *C03C 3/087* (2013.01); *C03C 3/093* (2013.01); *C03C 3/095* (2013.01); *C03C 21/00* (2013.01); *G01M 5/0033* (2013.01); *G06F 1/1613* (2013.01); *H05K 5/0217* (2013.01)

(58) Field of Classification Search
CPC ...... G01M 5/0033; C03C 3/087; C03C 3/093; C03C 3/095; C03C 21/00; G06F 1/1613; G06F 1/1656; H05K 5/0217
See application file for complete search history.

(56) References Cited

U.S. PATENT DOCUMENTS

| 5,602,329 | A | * | 2/1997 | Haubensak | .............. G01N 3/08 73/105 |
|---|---|---|---|---|---|
| 8,854,623 | B2 | | 10/2014 | Fontaine et al. | |
| 2006/0057421 | A1 | * | 3/2006 | Maria | ..................... B32B 18/00 428/688 |

(Continued)

FOREIGN PATENT DOCUMENTS

JP 2004233304 A * 8/2004

OTHER PUBLICATIONS

Scannell, Garth, et al. "Interaction between deformation and crack initiation under Vickers indentation in Na2O—TiO2—SiO2 glasses." Frontiers in Materials 4 (2017): 6. (Year: 2017).*

(Continued)

*Primary Examiner* — Catherine T. Rastovski
*Assistant Examiner* — Aeysha N Sultana
(74) *Attorney, Agent, or Firm* — Russell S. Magaziner

(57) ABSTRACT

Glass-based articles are provided that exhibit improved drop performance. The relationship between properties attributable to the glass composition and stress profile of the glass-based articles are provided that indicate improved drop performance.

20 Claims, 5 Drawing Sheets

(56) References Cited

U.S. PATENT DOCUMENTS

| | | | |
|---|---|---|---|
| 2014/0141226 A1 | 5/2014 | Bookbinder et al. | |
| 2016/0102011 A1 | 4/2016 | Hu et al. | |
| 2016/0102014 A1 | 4/2016 | Hu et al. | |
| 2016/0131564 A1* | 5/2016 | Hossain | G01N 3/08 73/799 |
| 2017/0305786 A1 | 10/2017 | Roussev et al. | |
| 2017/0355640 A1 | 12/2017 | Oram et al. | |
| 2018/0022635 A1 | 1/2018 | Luo et al. | |
| 2019/0084869 A1 | 3/2019 | Luo et al. | |

OTHER PUBLICATIONS

Wang, Subcritical Crack Growth Induced by Stress Corrosion in Quasibrittle Materials, University of Pittsburg 2013 (Year: 2013).*
Engineering Toolbox, (2005). Stress, Strain and Young's Modulus, [online] (Year: 2005).*
Frost et al. ,"Fracture Mechanics", 1974 (Year: 1974).*
Berry, J. P., "Determination of Fracture Surface Energies by the Cleavage Technique", Journal of Applied Physics, vol. 34, No. 1, Jan. 1963, pp. 62-68.
Bradt, R. C. "Applying Fractography and Fracture Mechanics to the Energy and Mass of Crack Growth for Glass in the Mirror Region"; J. Eur. Ceram. Soc., 34, 3255-3262, (2014).
Dugnani et al.; "Analytical Model of Dynamic Crack Evolution in Tempered and Strengthened Glass Plates"; International Journal of Fracture, 190, 75-86, (2014).
Eagan et al.; "Effect of Composition on the Mechanical Properties of Aluminosilicate and Borosilicate Glasses"; J. Am. Ceram. Soc., 61, 27-30, (1978).
Fineberg et al; "Instability in Dynamic Fracture"; Phys. Rev. Lett., 67, 457-460, (1991).
Gopalakrishnan et al; "Quantitative Fractography of Mixed Mode Fracture in Glass and Ceramics"; J. Eur. Ceram. SPC., 34, 3247-3254, (2014).
Gross et al., "Fictive Temperature-independent Density And Minimum Indentation Size Effect In Calcium Aluminosilicate Glass", J. Appl. Phys., vol. 104, 2008, p. 063529-1-063529-10.
Gulati; "Frangibility of Tempered Soda-Lime Glass Sheet";, Glass Processing Days, The Fifth International Conference on Architectural and Automotive Glass, Sep. 13-15, 1997.
Han et al., "Indentation Creep of Na2O 3SiO2 Glasses with Various Water Contents", J. Am Cerom Soc, vol. 73, No. 12, 1990, pp. 3626-3632.
Hirao et al.; "Microhardness of SiO2 Glass in Various Environments", J. Am. Ceram. Soc., vol. 70, No. 7, 1987, pp. 497-502.
International Search Report and Written Opinion of the International Searching Authority; PCT/US19/034273; dated Sep. 19, 2019; 9 Pages; European Patent Office.

Johnson et al; "Microstructure of the Mist Zone on Glass Fracture Surfaces"; The Philosophical Magazine: A Journal of Theoretical Experimental and Applied Physics 17, 899-910, (1968).
Johnson et al; "On the Shape and Size of the Fracture Zones on Glass Fracture Surfaces" The Philosophical Magazine: A Journal of Theoretical Experimental and Applied Physics 14, 731-743, (1966).
Kirchner et al; "Comparison of the Stress-Intensity and Johnson-and-Holloway Criteria for Crack Branching in Rectangular Bars"; J. Am. Ceram. Soc. 70, 565-569, (1987).
Kokura, et al., "Defect Formation In SiO2 Glass During Fracture", Journal of Non-Crystalline Solids, vol. 111, 1989, pp. 269-276.
Krstic et al., "Toughening of Glasses by Metallic Particles", Journal of The American Ceramic Society, vol. 64, No. 9, Sep. 1981, pp. 499-504.
Lawn et al, "Probing Material Properties With Sharp Indenters: Retrospective", Journal of Material Science (2012) 47:11-22.
Lawn et al; "A Model for Crack Initiation in Elastic/Plastic Indentation Fields"; Journal of Materials Science 12, 2195-2199, (1977).
Marder et al; "Origin of Crack Tip Instabilities"; J. Mech. Phys. Solids 43, 1-48, (1995).
Mecholsky et al; "Prediction of Fracture Energy and Flaw Size in Glasses From Measurements of Mirror Size"; J. Am. Ceram. Soc., 57, 440-443, (1974).
Ravi-Chandar et al; "An Experimental Investigation Into Dynamic Fracture: II. Microstructural Aspects"; International Journal of Fracture 26, 65-80, (1984).
Ravi-Chandar et al; "An Experimental Investigation Into Dynamic Fracture: III. On Steady-State Crack Propagation and Crack Branching"; International Journal of Fracture 26, 141-154, (1984).
Rosales-Sosa et al; "Crack-Resistant Al2O3—SiO2 Glasses"; Sci Rep 6, 23620, (2016) 7 Pages.
Rosales-Sosa, et al; "High Elastic Moduli of a 54Al2O3—46Ta2O5 Glass Fabricated via Containerless Processing"; Sci Rep 5, 15233, (2015); 8 Pages.
Rouxel et al; "The Fracture Toughness of Inorganic Glasses"; J. Am. Ceram. Soc. 100, 43744396, (2017).
Shand E.B.; "Experimental Study of Fracture of Glass: I, The Fracture Process"; J. Am. Ceram. Soc., 37, 52-59, (1954).
Shand, E.B.; "Breaking Stress of Glass Determined From Dimensions of Fracture Mirrors"; J. Am. Ceram. Soc., 42, 474-477, (1959).
Shand, E.B.; "Experimental Study of Fracture of Glass: II, Experimental Data"; J. Am. Ceram. Soc., 37, 559-572, (1954).
Sharafat. A; Preparation, Characterization and Properties of Nitrogen Rich Glasses in Alkaline EARTH-Si—O—N Systems; Ph.D Thesis, Stockholm University, (2009); 123 Pages.
Sharon et al; "Local Crack Branching as a Mechanism for Instability in Dynamic Fracture"; Phys. Rev. Lett., 74, 5096-5099, (1995).
Shinkai et al; "Crack-Branching of Binary PbO—B2O3 Glasses"; J. Non-Cryst. Solids 52, 385-394, (1982).
Wiederhorn et al., "Fracture of Glass in Vacuum", Journal of The American Ceramic Society, vol. 57, No. 8, Aug. 1974, pp. 336-341.

* cited by examiner

METHOD FOR MEASURING FRACTURE TOUGHNESS OF GLASS

CROSS-REFERENCE TO RELATED APPLICATIONS

This application is a continuation of U.S. application Ser. No. 16/425,217 filed May 29, 2019, which claims priority to U.S. Application No. 62/678,560 filed May 31, 2018, both of which are incorporated by reference herein in their entirety.

BACKGROUND

Field

The present specification generally relates to glass compositions suitable for use as cover glass for electronic devices.

Technical Background

The mobile nature of portable devices, such as smart phones, tablets, portable media players, personal computers, and cameras, makes these devices particularly vulnerable to accidental dropping on hard surfaces, such as the ground. These devices typically incorporate cover glasses, which may become damaged upon impact with hard surfaces. In many of these devices, the cover glasses function as display covers, and may incorporate touch functionality, such that use of the devices is negatively impacted when the cover glasses are damaged.

There are two major failure modes of cover glass when the associated portable device is dropped on a hard surface. One of the modes is flexure failure, which is caused by bending of the glass when the device is subjected to dynamic load from impact with the hard surface. The other mode is sharp contact failure, which is caused by introduction of damage to the glass surface. Impact of the glass with rough hard surfaces, such as asphalt, granite, etc., can result in sharp indentations in the glass surface. These indentations become failure sites in the glass surface from which cracks may develop and propagate.

Glass can be made more resistant to flexure failure by the ion-exchange technique, which involves inducing compressive stress in the glass surface. However, the ion-exchanged glass will still be vulnerable to dynamic sharp contact, owing to the high stress concentration caused by local indentations in the glass from the sharp contact.

It has been a continuous effort for glass makers and handheld device manufacturers to improve the resistance of handheld devices to sharp contact failure. Solutions range from coatings on the cover glass to bezels that prevent the cover glass from impacting the hard surface directly when the device drops on the hard surface. However, due to the constraints of aesthetic and functional requirements, it is very difficult to completely prevent the cover glass from impacting the hard surface.

It is also desirable that portable devices be as thin as possible. Accordingly, in addition to strength, it is also desired that glasses to be used as cover glass in portable devices be made as thin as possible. Thus, in addition to increasing the strength of the cover glass, it is also desirable for the glass to have mechanical characteristics that allow it to be formed by processes that are capable of making thin glass articles, such as thin glass sheets.

Accordingly, a need exists for glasses that can be strengthened, such as by ion exchange, and that have the mechanical properties that allow them to be formed as thin glass articles.

SUMMARY

According to aspect (1), a glass-based article is provided. The glass-based article comprises: a compressive stress layer extending from a surface of the glass-based article to a depth of compression. The glass-based article is characterized by $K_{IC}^2 \times DOC/t \times \sqrt{STE} \geq 7.0 \times 10^{11} Pa^{2.5} m^{1.5}$ where $K_{IC}$ is the fracture toughness in $Pa \cdot m^{0.5}$ of a glass-based substrate having a composition and phase assemblage equivalent to the composition and phase assemblage at the center of the glass-based article, DOC is the depth of compression in meters, t is the thickness of the glass-based article in meters, and STE is the stored strain energy of the glass-based article in $Pa \cdot m$.

According to aspect (2), the glass-based article of aspect (1) is provided, wherein: $K_{IC}^2 \times DOC/t \times \sqrt{STE} \geq 8.0 \times 10^{11} Pa^{2.5} m^{1.5}$.

According to aspect (3), the glass-based article of aspect (1) or (2) is provided, wherein: $K_{IC}^2 \times DOC/t \times \sqrt{STE} \geq 9.0 \times 10^{11} Pa^{2.5} m^{1.5}$.

According to aspect (4), the glass-based article of any of aspects (1) to (3) is provided, wherein: $K_{IC}^2 \times DOC/t \times \sqrt{STE} \geq 9.5 \times 10^{11} Pa^{2.5} m^{1.5}$.

According to aspect (5), the glass-based article of any of aspects (1) to (4) is provided, wherein: $K_{IC}^2 \times DOC/t \times \sqrt{STE} \geq 1.0 \times 10^{12} Pa^{2.5} m^{1.5}$.

According to aspect (6), a glass-based article is provided. The glass-based article comprises: a compressive stress layer extending from a surface of the glass-based article to a depth of compression. The glass-based article is characterized by $K_{IC}^2 \times DOC \times \sqrt{STE} \geq 5.6 \times 10^8 Pa^{2.5} m^{2.5}$ where $K_{IC}$ is the fracture toughness in $Pa \cdot m^{0.5}$ of a glass-based substrate having a composition and phase assemblage equivalent to the composition and phase assemblage at the center of the glass-based article, DOC is the depth of compression in meters, t is the thickness of the glass-based article in meters, and STE is the stored strain energy of the glass-based article in $Pa \cdot m$.

According to aspect (7), the glass-based article of aspect (6) is provided, wherein: $K_{IC}^2 \times DOC \times \sqrt{STE} \geq 6.0 \times 10^8 Pa^{2.5} m^{2.5}$.

According to aspect (8), the glass-based article of aspect (6) or (7) is provided, $K_{IC}^2 \times DOC \times \sqrt{STE} \geq 7.0 \times 10^8 Pa^{2.5} m^{2.5}$.

According to aspect (9), the glass-based article of any of aspects (6) to (8) is provided, wherein: $K_{IC}^2 \times DOC \times \sqrt{STE} \geq 8.0 \times 10^8 Pa^{2.5} m^{2.5}$.

According to aspect (10), a glass-based article is provided. The glass-based article comprises: a compressive stress layer extending from a surface of the glass-based article to a depth of compression. The glass-based article is characterized by $K_{IC}^2 \times DOC \times H/E \times \sqrt{STE} \geq 4.1 \times 10^7 Pa^{2.5} m^{2.5}$ where $K_{IC}$ is the fracture toughness in $Pa \cdot m^{0.5}$ of a glass-based substrate having a composition and phase assemblage equivalent to the composition and phase assemblage at the center of the glass-based article, DOC is the depth of compression in meters, H is the hardness in Pascals of a glass-based substrate having a composition and phase assemblage equivalent to the composition and phase assemblage at the center of the glass-based article, E is the Young's modulus in Pascals of a glass-based substrate having a composition and phase assemblage equivalent to the composition and phase assemblage at the center of the glass-based article, and STE is the stored strain energy of the glass-based article in Pa·m.

According to aspect (11), the glass-based article of aspect (10) is provided, wherein: $K_{IC}^2 \times DOC \times \sqrt{STE} \geq 4.5 \times 10^7 Pa^{2.5} m^{2.5}$.

According to aspect (12), the glass-based article of aspect (10) or (11) is provided, wherein: $K_{IC}^2 \times DOC \times \sqrt{STE} \geq 5.0 \times 10^7 Pa^{2.5} m^{2.5}$.

According to aspect (13), the glass-based article of any of aspects (10) to (12) is provided, wherein: $K_{IC}^2 \times DOC \times H/E \times \sqrt{STE} \geq 5.5 \times 10^7 Pa^{2.5} m^{2.5}$.

According to aspect (14), the glass-based article of any of the preceding aspects is provided, wherein DOC≥75 μm.

According to aspect (15), the glass-based article of any of the preceding aspects is provided, wherein DOC≤300 μm.

According to aspect (16), the glass-based article of any of the preceding aspects is provided, wherein DOC≤0.4 t.

According to aspect (17), the glass-based article of any of the preceding aspects is provided, wherein DOC≥0.1 t.

According to aspect (18), the glass-based article of any of the preceding aspects is provided, comprising a maximum central tension CT greater than or equal to 95 MPa.

According to aspect (19), the glass-based article of any of the preceding aspects is provided, comprising a maximum central tension CT less than or equal to $120/\sqrt{t}$ MPa, where t is in mm.

According to aspect (20), the glass-based article of any of the preceding aspects is provided, wherein the glass-based article has a thickness t≤1.0 mm.

According to aspect (21), the glass-based article of any of the preceding aspects is provided, wherein the glass-based article has a thickness t≥0.3 mm.

According to aspect (22), the glass-based article of any of the preceding aspects is provided, wherein STE≥20Pa·m.

According to aspect (23), the glass-based article of any of aspects (1) to (21) is provided, wherein 5Pa·m≤STE≤10Pa·m.

According to aspect (24), the glass-based article of any of the preceding aspects is provided, wherein the compressive stress layer comprises a compressive stress CS of greater than or equal to 100 MPa.

According to aspect (25), the glass-based article of any of the preceding aspects is provided, wherein the compressive stress layer comprises a compressive stress CS of greater than or equal to 400 MPa.

According to aspect (26), the glass-based article of any of the preceding aspects is provided, wherein the compressive stress layer comprises a compressive stress CS of less than or equal to 1300 MPa.

According to aspect (27), the glass-based article of any of the preceding aspects is provided, wherein the glass-based article comprises a glass ceramic.

According to aspect (28), the glass-based article of any of the preceding aspects is provided, wherein the glass-based article comprises $SiO_2$, $Al_2O_3$, $B_2O_3$, and at least one alkali metal oxide.

According to aspect (29), the glass-based article of any of the preceding aspects is provided, wherein a glass-based substrate having a composition and phase assemblage equivalent to the composition and phase assemblage at the center of the glass-based article has a $K_{IC}$ greater than or equal to 0.75 MPa$\sqrt{m}$.

According to aspect (30), the glass-based article of any of the preceding aspects is provided, wherein a glass-based substrate having a composition and phase assemblage equivalent to the composition and phase assemblage at the center of the glass-based article has a $K_{IC}$ less than or equal to 1.5 MPa$\sqrt{m}$.

According to aspect (31), the glass-based article of any of the preceding aspects is provided, wherein a glass-based substrate having a composition and phase assemblage equivalent to the composition and phase assemblage at the center of the glass-based article has a hardness H greater than or equal to 6.0 GPa.

According to aspect (32), the glass-based article of any of the preceding aspects is provided, wherein a glass-based substrate having a composition and phase assemblage equivalent to the composition and phase assemblage at the center of the glass-based article has a hardness H less than or equal to 8.0 GPa.

According to aspect (33), the glass-based article of any of the preceding aspects is provided, wherein a glass-based substrate having a composition and phase assemblage equivalent to the composition and phase assemblage at the center of the glass-based article has a Young's modulus E greater than or equal to 80 GPa.

According to aspect (34), the glass-based article of any of the preceding aspects is provided, wherein a glass-based substrate having a composition and phase assemblage equivalent to the composition and phase assemblage at the center of the glass-based article has a Young's modulus E less than or equal to 120 GPa.

According to aspect (35), a method is provided. The method comprises: ion exchanging a glass-based substrate to form a glass-based article having a compressive stress layer extending from a surface of the glass-based article to a depth of compression. The glass-based article is characterized by $K_{IC}^2 \times DOC/t \times \sqrt{STE} \geq 7.0 \times 10^7 Pa^{2.5} m^{2.5}$ where $K_{IC}$ is the fracture toughness in Pa·m$^{0.5}$ of the glass-based substrate, DOC is the depth of compression in meters, t is the thickness of the glass-based article in meters, and STE is the stored strain energy of the glass-based article in Pa·m.

According to aspect (36), a method is provided. The method comprises: ion exchanging a glass-based substrate to form a glass-based article having a compressive stress layer extending from a surface of the glass-based article to a depth of compression. The glass-based article is characterized by $K_{IC}^2 \times DOC/t \times \sqrt{STE} \geq 4.1 \times 10^7 Pa^{2.5} m^{2.5}$ where $K_{IC}$ is the fracture toughness in Pa·m$^{0.5}$ of the glass-based substrate, DOC is the depth of compression in meters, H is the hardness in Pascals of the glass-based substrate, E is the Young's modulus in Pascals of the glass-based substrate, and STE is the stored strain energy of the glass-based article in Pa·m.

According to aspect (37), the method of aspect (35) or (36) is provided, wherein the glass-based substrate comprises a glass ceramic.

According to aspect (38), the method of any of aspects (35) to (37) is provided, wherein the ion exchanging comprises contacting the glass-based substrate with a molten salt bath.

According to aspect (39), the method of aspect (38) is provided, wherein the molten salt bath comprises at least one of sodium nitrate and potassium nitrate.

According to aspect (40), the method of aspect (38) or (39) is provided, wherein the contacting extends for greater than or equal to 4 hours to less than or equal to 48 hours.

According to aspect (41), the method of any of aspects (38) to (40) is provided, wherein during the contacting the molten salt bath is at a temperature of greater than or equal to 400° C. to less than or equal to 500° C.

According to aspect (42), a glass-based article produced by the method of any of aspects (35) to (41).

According to aspect (43), a consumer electronic product is provided. The consumer electronic product comprises: a housing having a front surface, a back surface and side surfaces; electrical components provided at least partially within the housing, the electrical components including at least a controller, a memory, and a display, the display being provided at or adjacent the front surface of the housing; and a cover glass disposed over the display, wherein at least one of a portion of the housing or a portion of the cover glass comprises the glass-based article of any of aspects (1) to (34) or (42).

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
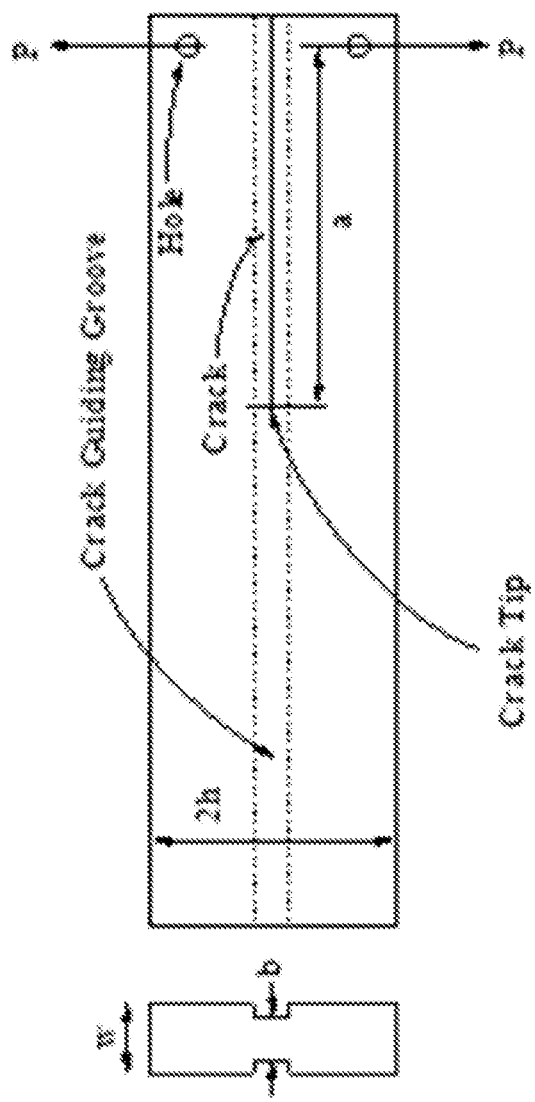
FIG. 1 is a schematic representation of a sample utilized to determine the fracture toughness $K_{IC}$ and a cross-section thereof.

Reference will now be made in detail to glass-based articles according to various embodiments. As utilized herein, "glass-based" indicates an article that includes a glass, such as glass or glass-ceramic compositions. In general, a "glass-based substrate" refers to an article prior to ion exchange, and a "glass-based article" refers to an ion exchanged article.

The glass-based articles exhibit improved drop performance. The glass-based articles include a compressive stress layer extending from a surface of the glass-based article to a depth of compression. The glass-based articles exhibit a minimum value of formulas that correlate to the desired drop performance based on a variety of properties influenced by the glass composition and the stress profile characteristics of the glass-based articles.

In some embodiments, the glass-based articles are characterized by the following formula (I):

$$K_{IC}^2 \frac{DOC}{t} \sqrt{STE} \geq 7.0 \times 10^{11} Pa^{2.5} m^{1.5}$$

where $K_{IC}$ is the fracture toughness in $Pa \cdot m^{0.5}$ of a glass-based substrate having a composition and phase assemblage equivalent to the composition and phase assemblage at the center of the glass-based article, DOC is the depth of compression in meters, t is the thickness of the glass-based article in meters, and STE is the stored tensile energy of the glass-based article in $Pa \cdot m$. The dependence of formula (I) on the thickness of the glass-based article allows the comparison of the performance of glass-based articles across different thicknesses. In embodiments, the glass-based articles may exhibit values of formula (I) greater than or equal to $8.0 \times 10^{11} Pa^{2.5} m^{1.5}$, such as greater than or equal to greater than or equal to $9.0 \times 10^{11} Pa^{2.5} m^{1.5}$, greater than or equal to $9.5 \times 10^{11} Pa^{2.5} m^{1.5}$, greater than or equal to $1.0 \times 10^{12} Pa^{2.5} m^{1.5}$, or more.

In some embodiments, the glass-based articles are characterized by the following formula (IA):

$$K_{IC}^2 DOC \sqrt{STE} \geq 5.6 \times 10^8 Pa^{2.5} m^{2.5}$$

where $K_{IC}$ is the fracture toughness in $Pa \cdot m^{0.5}$ of a glass-based substrate having a composition and phase assemblage equivalent to the composition and phase assemblage at the center of the glass-based article, DOC is the depth of compression in meters, and STE is the stored tensile energy of the glass-based article in $Pa \cdot m$. In embodiments, the glass-based articles may exhibit values of formula (IA) greater than or equal to $6.0 \times 10^8 Pa^{2.5} m^{2.5}$, such as greater than or equal to greater than or equal to $6.5 \times 10 Pa^{2.5} m^{2.5}$, greater than or equal to $7.5 \times 10^8 Pa^{2.5} m^{2.5}$, greater than or equal $8.0 \times 10^8 Pa^{2.5} m^{2.5}$, or more.

In some embodiments, the glass-based articles are characterized by the following formula (II):

$$K_{IC}^2 DOC \frac{H}{E} \sqrt{STE} \geq 4.1 \times 10^7 Pa^{2.5} m^{2.5}$$

where $K_{IC}$ is the fracture toughness in $Pa \cdot m^{0.5}$ of a glass-based substrate having a composition and phase assemblage equivalent to the composition and phase assemblage at the center of the glass-based article, DOC is the depth of compression in meters, H is the hardness in Pascals of a glass-based substrate having a composition and phase assemblage equivalent to the composition and phase assemblage at the center of the glass-based article, E is the Young's modulus in Pascals of a glass-based substrate having a composition and phase assemblage equivalent to the composition and phase assemblage at the center of the glass-based article, and STE is the stored tensile strain energy of the glass-based article in $Pa \cdot m$. In embodiments, the glass-based articles may exhibit values of formula (II) greater than or equal to $4.5 \times 10^7 Pa^{2.5} m^{2.5}$, such as greater than or equal to $5.0 \times 10^7 Pa^{2.5} m^{2.5}$, greater than or equal to $5.5 \times 10^7 Pa^{2.5} m^{2.5}$, or more.

The glass-based articles that satisfy either or both of formulas (I), (IA), and (II) exhibit improved drop performance, a quality that makes the glass-based articles particularly suitable for use in electronic devices. In this manner, the effect of the particular combination of properties attributable to the glass composition and the properties attributable to the stress profile of the glass-based articles may be considered as a whole when selecting glass-based articles for use in electronic devices. The $K_{IC}$ is included in the formulas as indicating the energy necessary to propagate a crack, and failure of the glass-based articles is dependent at least in part on the propagation of a crack into the tensile region. The drop performance is proportional to the square of the $K_{IC}$. The DOC is included in the formulas as indicating the depth to which a crack must propagate to reach the tensile region, with deeper a DOC providing greater resistance to failure by requiring a greater crack propagation depth before reaching the tensile region. The STE is included in the formulas as indicative of the degree of strengthening due to ion exchange, which may increase the resistance to failure of the glass-based article. The square root of the STE is incorporated due to the relationship between the square root of the STE and the frangibility limit of the glass-based article.

In formulas (I), (IA), and (II), the properties that refer to a glass-based substrate having a composition and phase assemblage equivalent to the composition and phase assemblage at the center of the glass-based article generally are dependent on the composition and phase assemblage of the glass-based substrate that was ion exchanged to form the glass-based article. In practice, the composition and phase assemblage at the center of the glass-based article may be measured by techniques known in the art, and the $K_{IC}$, H, and E values of glass-based substrates produced having the measured composition and phase assemblage may be measured. Additionally, the center of the glass-based article is not affected by or minimally affected by the ion exchange process, such that the composition and phase assemblage at the center of the glass-based article is substantially the same or the same as the composition of the glass-based substrate. For this reason, the $K_{IC}$, H, and E values of a glass-based substrate having the composition and phase assemblage at the center of the glass-based article may be determined by measuring these properties of the glass-based substrate before the ion exchange treatment.

The properties of the glass-based articles will now be discussed. These properties can be achieved by modifying the component amounts of the glass-based composition or the stress profile of the glass-based article.

Compositions utilized to form the glass-based articles according to embodiments have a high fracture toughness ($K_{IC}$). As demonstrated by formulas (I) and (II) above, the fracture toughness has a strong influence on the drop performance of the glass-based articles. In some embodiments, the compositions utilized to form the glass-based articles exhibit a $K_{IC}$ value greater than or equal to 0.75 MPa·m$^{0.5}$, such as greater than or equal to 0.76 MPa·m$^{0.5}$, greater than or equal to 0.77 MPa·m$^{0.5}$, greater than or equal to 0.78 MPa·m$^{0.5}$, greater than or equal to 0.79 MPa·m$^{0.5}$, greater than or equal to 0.80 MPa·m$^{0.5}$, greater than or equal to 0.81 MPa·m$^{0.5}$, greater than or equal to 0.82 MPa·m$^{0.5}$, greater than or equal to 0.83 MPa·m$^{0.5}$, greater than or equal to 0.84 MPa·m$^{0.5}$, greater than or equal to 0.86 MPa·m$^{0.5}$, greater than or equal to 0.87 MPa·m$^{0.5}$, greater than or equal to 0.88 MPa·m$^{0.5}$, greater than or equal to 0.89 MPa·m$^{0.5}$, greater than or equal to 0.90 MPa·m$^{0.5}$, greater than or equal to 0.91 MPa·m$^{0.5}$, greater than or equal to 0.92 MPa·m$^{0.5}$, greater than or equal to 0.93 MPa·m$^{0.5}$, greater than or equal to 0.94 MPa·m$^{0.5}$, greater than or equal to 0.95 MPa·m$^{0.5}$, greater than or equal to 0.96 MPa·m$^{0.5}$, greater than or equal to 0.97 MPa·m$^{0.5}$, greater than or equal to 0.98 MPa·m$^{0.5}$, greater than or equal to 0.99 MPa·m$^{0.5}$, greater than or equal to 1.00 MPa·m$^{0.5}$, greater than or equal to 1.01 MPa·m$^{0.5}$, greater than or equal to 1.02 MPa·m$^{0.5}$, greater than or equal to 1.03 MPa·m$^{0.5}$, greater than or equal to 1.04 MPa·m$^{0.5}$, greater than or equal to 1.05 MPa·m$^{0.5}$, greater than or equal to 1.06 MPa·m$^{0.5}$, greater than or equal to 1.07 MPa·m$^{0.5}$, greater than or equal to 1.08 MPa·m$^{0.5}$, greater than or equal to 1.09 MPa·m$^{0.5}$, greater than or equal to 1.10 MPa·m$^{0.5}$, greater than or equal to 1.11 MPa·m$^{0.5}$, greater than or equal to 1.12 MPa·m$^{0.5}$, greater than or equal to 1.13 MPa·m$^{0.5}$, greater than or equal to 1.14 MPa·m$^{0.5}$, greater than or equal to 1.15 MPa·m$^{0.5}$, greater than or equal to 1.16 MPa·m$^{0.5}$, greater than or equal to 1.17 MPa·m$^{0.5}$, greater than or equal to 1.18 MPa·m$^{0.5}$, greater than or equal to 1.19 MPa·m$^{0.5}$, greater than or equal to 1.20 MPa·m$^{0.5}$, greater than or equal to 1.21 MPa·m$^{0.5}$, greater than or equal to 1.22 MPa·m$^{0.5}$, greater than or equal to 1.23 MPa·m$^{0.5}$, greater than or equal to 1.24 MPa·m$^{0.5}$, greater than or equal to 1.25 MPa·m$^{0.5}$, greater than or equal to 1.26 MPa·m$^{0.5}$, greater than or equal to 1.27 MPa·m$^{0.5}$, greater than or equal to 1.28 MPa·m$^{0.5}$, greater than or equal to 1.29 MPa·m$^{0.5}$, greater than or equal to 1.30 MPa·m$^{0.5}$, greater than or equal to 1.31 MPa·m$^{0.5}$, greater than or equal to 1.32 MPa·m$^{0.5}$, greater than or equal to 1.33 MPa·m$^{0.5}$, or greater than or equal to 1.34 MPa·m$^{0.5}$. In embodiments, the compositions utilized to form the glass-based articles exhibit a $K_{IC}$ value greater than or equal to 0.75 MPa·m$^{0.5}$ to less than or equal to 1.34 MPa·m$^{0.5}$, such as from greater than or equal to 0.76 MPa·m$^{0.5}$ to less than or equal to 1.33 MPa·m$^{0.5}$, from greater than or equal to 0.77 MPa·m$^{0.5}$ to less than or equal to 1.32 MPa·m$^{0.5}$, from greater than or equal to 0.78 MPa·m$^{0.5}$ to less than or equal to 1.31 MPa·m$^{0.5}$, from greater than or equal to 0.79 MPa·m$^{0.5}$ to less than or equal to 1.30 MPa·m$^{0.5}$, from greater than or equal to 0.80 MPa·m$^{0.5}$ to less than or equal to 1.29, from greater than or equal to 0.81 MPa·m$^{0.5}$ to less than or equal to 1.28 MPa·m$^{0.5}$, from greater than or equal to 0.82 MPa·m$^{0.5}$ to less than or equal to 1.27 MPa·m$^{0.5}$, from greater than or equal to 0.83 MPa·m$^{0.5}$ to less than or equal to 1.26 MPa·m$^{0.5}$, from greater than or equal to 0.84 MPa·m$^{0.5}$ to less than or equal to 1.25 MPa·m$^{0.5}$, from greater than or equal to 0.85 MPa·m$^{0.5}$ to less than or equal to 1.24 MPa·m$^{0.5}$, from greater than or equal to 0.86 MPa·m$^{0.5}$ to less than or equal to 1.23 MPa·m$^{0.5}$, from greater than or equal to 0.87 MPa·m$^{0.5}$ to less than or equal to 1.22 MPa·m$^{0.5}$, from greater than or equal to 0.88 MPa·m$^{0.5}$ to less than or equal to 1.21 MPa·m$^{0.5}$, from greater than or equal to 0.89 MPa·m$^{0.5}$ to less than or equal to 1.20 MPa·m$^{0.5}$, from greater than or equal to 0.90 MPa·m$^{0.5}$ to less than or equal to 1.19 MPa·m$^{0.5}$, from greater than or equal to 0.91 MPa·m$^{0.5}$ to less than or equal to 1.18 MPa·m$^{0.5}$, from greater than or equal to 0.92 MPa·m$^{0.5}$ to less than or equal to 1.17 MPa·m$^{0.5}$, from greater than or equal to 0.93 MPa·m$^{0.5}$ to less than or equal to 1.16 MPa·m$^{0.5}$, from greater than or equal to 0.94 MPa·m$^{0.5}$ to less than or equal to 1.15 MPa·m$^{0.5}$, from greater than or equal to 0.95 MPa·m$^{0.5}$ to less than or equal to 1.14 MPa·m$^{0.5}$, from greater than or equal to 0.96 MPa·m$^{0.5}$ to less than or equal to 1.13 MPa·m$^{0.5}$, from greater than or equal to 0.97 MPa·m$^{0.5}$ to less than or equal to 1.12 MPa·m$^{0.5}$, from greater than or equal to 0.98 MPa·m$^{0.5}$ to less than or equal to 1.11 MPa·m$^{0.5}$, from greater than or equal to 0.99 MPa·m$^{0.5}$ to less than or equal to 1.10 MPa·m$^{0.5}$, from greater than or equal to 1.00 MPa·m$^{0.5}$ to less than or equal to 1.09 MPa·m$^{0.5}$, from greater than or equal to 1.01 MPa·m$^{0.5}$ to less than or equal to 1.08 MPa·m$^{0.5}$, from greater than or equal to 1.02 MPa·m$^{0.5}$ to less than or equal to 1.07 MPa·m$^{0.5}$, from greater than or equal to 1.03 MPa·m$^{0.5}$ to less than or equal to 1.06 MPa·m$^{0.5}$, from greater than or equal to 1.04 MPa·m$^{0.5}$ to less than or equal to 1.05 MPa·m$^{0.5}$, and all ranges and sub-ranges between the foregoing values. In some embodiments, the compositions utilized to form the glass-based articles exhibit a $K_{IC}$ value greater than or equal to 0.90 MPa·m$^{0.5}$. In some embodiments, the compositions utilized to form the glass-based articles exhibit a $K_{IC}$ value less than or equal to 1.5 MPa·m$^{0.5}$.

As utilized herein, the $K_{IC}$ fracture toughness is measured by the double cantilever beam (DCB) method. The $K_{IC}$ values were measured on glass-based substrates before being ion exchanged to form the glass-based articles. The DCB specimen geometry is shown in FIG. 1 with important parameters being the crack length a, applied load P, cross-sectional dimensions w and 2 h, and the thickness of the crack-guiding groove b. The samples were cut into rectangles of width 2 h=1.25 cm and a thickness ranging from, w=0.3 mm to 1 mm, with the overall length of the sample, which is not a critical dimension, varying from 5 cm to 10 cm. A hole was drilled on both ends with a diamond drill to provide a means of attaching the sample to a sample holder and to the load. A crack "guiding groove" was cut down the length of the sample on both flat faces using a wafer dicing saw with a diamond blade, leaving a "web" of material, approximately half the total plate thickness (dimension b in FIG. 1), with a height of 180 µm corresponding to the blade thickness. The high precision dimensional tolerances of the dicing saw allow for minimal sample-to-sample variation. The dicing saw was also used to cut an initial crack where a=15 mm. As a consequence of this final operation a very thin wedge of material was created near the crack tip (due to the blade curvature) allowing for easier crack initiation in the sample. The samples were mounted in a metal sample holder with a steel wire in the bottom hole of the sample. The samples were also supported on the opposite end to keep the samples level under low loading conditions. A spring in series with a load cell (FUTEK, LSB200) was hooked to the upper hole which was then extended, to gradually apply load, using rope and a high precision slide. The crack was monitored using a microscope having a 5 µm resolution attached to a digital camera and a computer. The applied stress intensity, $K_P$, was calculated using the following equation (III):

$$K_P = \left[\frac{P \cdot a}{(w \cdot b)^{0.5} h^{1.5}}\right]\left[3.47 + 2.32\frac{h}{a}\right]$$

For each sample, a crack was first initiated at the tip of the web, and then the starter crack was carefully sub-critically grown until the ratio of dimensions a/h was greater than 1.5, which is required for equation (III) to accurately calculate stress intensity. At this point the crack length, a, was measured and recorded using a traveling microscope with 5 µm resolution. A drop of toluene was then placed into the crack groove and wicked along the entire length of groove by capillary forces, pinning the crack from moving until the fracture toughness is reached. The load was then increased until sample fracture occurred, and the critical stress intensity $K_{IC}$ calculated from the failure load and sample dimensions, with $K_P$ being equivalent to $K_{IC}$ due to the measurement method.

The Young's modulus (E) of the glass compositions utilized to form the glass-based articles has a negative correlation with the drop performance of the glass-based articles, as demonstrated by formulas (I) and (II). In embodiments, the compositions utilized to form the glass-based articles exhibit a Young's modulus (E) from greater than or equal to 75 GPa to less than or equal to 120 GPa, such as from greater than or equal to 76 GPa to less than or equal to 115 GPa, from greater than or equal to 77 GPa to less than or equal to 113 GPa, from greater than or equal to 78 GPa to less than or equal to 112 GPa, from greater than or equal to 79 GPa to less than or equal to 111 GPa, from greater than or equal to 80 GPa to less than or equal to 110 GPa, from greater than or equal to 81 GPa to less than or equal to 109 GPa, from greater than or equal to 82 GPa to less than or equal to 108 GPa, from greater than or equal to 83 GPa to less than or equal to 107 GPa, from greater than or equal to 84 GPa to less than or equal to 106 GPa, from greater than or equal to 85 GPa to less than or equal to 105 GPa, from greater than or equal to 86 GPa to less than or equal to 104 GPa, from greater than or equal to 87 GPa to less than or equal to 103 GPa, from greater than or equal to 88 GPa to less than or equal to 102 GPa, from greater than or equal to 89 GPa to less than or equal to 101 GPa, from greater than or equal to 90 GPa to less than or equal to 100 GPa, from greater than or equal to 91 GPa to less than or equal to 99 GPa, from greater than or equal to 92 GPa to less than or equal to 98 GPa, from greater than or equal to 93 GPa to less than or equal to 97 GPa, from greater than or equal to 94 GPa to less than or equal to 96 GPa, or equal to 95 GPa, and all ranges and sub-ranges between the foregoing values. In embodiments, the compositions utilized to form the glass-based articles exhibit a Young's modulus (E) from greater than or equal to 80 GPa to less than or equal to 120 GPa. The Young's modulus values recited in this disclosure refer to a value as measured by a resonant ultrasonic spectroscopy technique of the general type set forth in ASTM E2001-13, titled "Standard Guide for Resonant Ultrasound Spectroscopy for Defect Detection in Both Metallic and Nonmetallic Parts."

The hardness (H) of the glass compositions utilized to form the glass-based articles has a positive correlation with the drop performance of the glass-based articles, as demonstrated by formulas (I) and (II). In embodiments, the compositions utilized to form the glass-based articles exhibit a hardness (H) from greater than or equal to 6.0 GPa to less than or equal to 8.0 GPa, such as from greater than or equal to 6.1 GPa to less than or equal to 7.9 GPa, from greater than or equal to 6.2 GPa to less than or equal to 7.8 GPa, from greater than or equal to 6.3 GPa to less than or equal to 7.7 GPa, from greater than or equal to 6.4 GPa to less than or equal to 7.6 GPa, from greater than or equal to 6.5 GPa to less than or equal to 7.5 GPa, from greater than or equal to 6.6 GPa to less than or equal to 7.4 GPa, from greater than or equal to 6.7 GPa to less than or equal to 7.3 GPa, from greater than or equal to 6.8 GPa to less than or equal to 7.2 GPa, from greater than or equal to 6.9 GPa to less than or equal to 7.1 GPa, or equal to 7.0 GPa, and all ranges and sub-ranges between the foregoing values. The hardness values recited in this disclosure refer to a value as measured by Vickers hardness test. The Vickers hardness test included indentation with a Vickers indenter tip for 15 seconds with a 200 gram load.

The glass-based articles may have any suitable thickness. The thickness (t) of the glass-based articles has a negative correlation with the drop performance of the glass-based articles, as demonstrated by formula (I). In embodiments, the glass-based articles may have a thickness (t) from greater than or equal to 0.2 mm to less than or equal to 2.0 mm, such as from greater than or equal to 0.3 mm to less than or equal to 1.0 mm, from greater than or equal to 0.4 mm to less than or equal to 0.9 mm, from greater than or equal to 0.5 mm to less than or equal to 0.8 mm, from greater than or equal to 0.6 mm to less than or equal to 0.7 mm, and all ranges and sub-ranges between the foregoing values.

Figure 2:
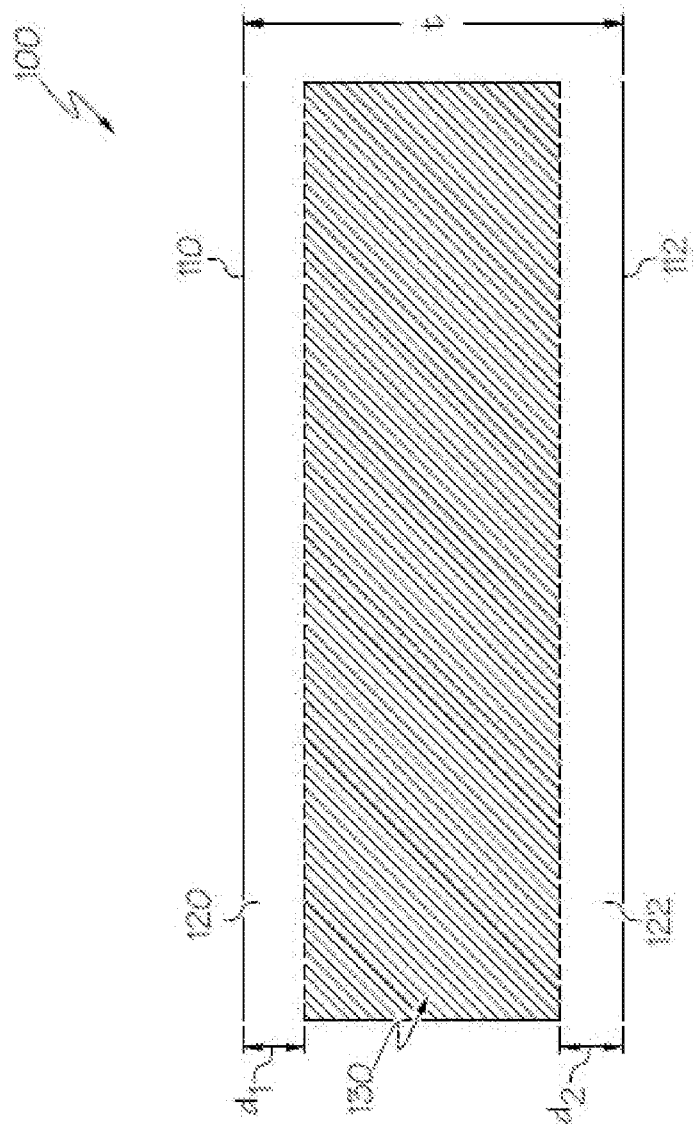
FIG. 2 schematically depicts a cross section of a glass-based article having compressive stress layers on surfaces thereof according to embodiments disclosed and described herein.

As mentioned above, glass-based articles are strengthened, such as by ion exchange, making a glass that is damage resistant for applications such as, but not limited to, articles for display covers or electronic device housings. With reference to FIG. 2, the glass-based article has a first region under compressive stress (e.g., first and second compressive layers 120, 122 in FIG. 2) extending from the surface to a depth of compression (DOC) of the glass-based article and a second region (e.g., central region 130 in FIG. 2) under a tensile stress or central tension (CT) extending from the DOC into the central or interior region of the glass-based article. As used herein, DOC refers to the depth at which the stress within the glass-based article changes from compressive to tensile. At the DOC, the stress crosses from a positive (compressive) stress to a negative (tensile) stress and thus exhibits a stress value of zero.

According to the convention normally used in the art, compression or compressive stress is expressed as a negative (<0) stress and tension or tensile stress is expressed as a positive (>0) stress. Throughout this description, however, CS is expressed as a positive or absolute value—i.e., as recited herein, CS=|CS|. The compressive stress (CS) has a maximum at or near the surface of the glass-based article, and the CS varies with distance d from the surface according to a function. Referring again to FIG. 2, a first segment 120 extends from first surface 110 to a depth $d_1$ and a second segment 122 extends from second surface 112 to a depth $d_2$. Together, these segments define a compression or CS of glass-based article 100. Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

In some embodiments, the CS of the glass-based article is from greater than or equal to 300 MPa to less than or equal to 1300 MPa, such as from greater than or equal to 325 MPa to less than or equal to 1250 MPa, from greater than or equal to 350 MPa to less than or equal to 1200 MPa, from greater than or equal to 375 MPa to less than or equal to 1150 MPa, from greater than or equal to 400 MPa to less than or equal to 1100 MPa, from greater than or equal to 425 MPa to less than or equal to 1050 MPa, from greater than or equal to 450 MPa to less than or equal to 1000 MPa, from greater than or equal to 475 MPa to less than or equal to 975 MPa, from greater than or equal to 500 MPa to less than or equal to 950 MPa, from greater than or equal to 525 MPa to less than or equal to 925 MPa, from greater than or equal to 550 MPa to less than or equal to 900 MPa, from greater than or equal to 575 MPa to less than or equal to 875 MPa, from greater than or equal to 600 MPa to less than or equal to 850 MPa, from greater than or equal to 625 MPa to less than or equal to 825 MPa, from greater than or equal to 650 MPa to less than or equal to 800 MPa, from greater than or equal to 675 MPa to less than or equal to 775 MPa, or from greater than or equal to 700 MPa to less than or equal to 750 MPa, and all ranges and sub-ranges between the foregoing values. In some embodiments, the CS of the glass-based article is greater than or equal to 100 MPa.

In one or more embodiments, $Na^+$ and $K^+$ ions are exchanged into the glass-based article and the $Na^+$ ions diffuse to a deeper depth into the glass article than the $K^+$ ions. The depth of penetration of $K^+$ ions ("Potassium DOL") is distinguished from DOC because it represents the depth of potassium penetration as a result of an ion exchange process. The Potassium DOL is typically less than the DOC for the articles described herein. Potassium DOL is measured using a surface stress meter such as the commercially available FSM-6000 surface stress meter, manufactured by Orihara Industrial Co., Ltd. (Japan), which relies on accurate measurement of the stress optical coefficient (SOC), as described above with reference to the CS measurement. The Potassium DOL of each of first and second compressive layers 120, 122 is from greater than or equal to 5 μm to less than or equal to 30 μm, such as from greater than or equal to 6 μm to less than or equal to 25 μm, from greater than or equal to 7 μm to less than or equal to 20 μm, from greater than or equal to 8 μm to less than or equal to 15 μm, or from greater than or equal to 9 μm to less than or equal to 10 μm, and all ranges and sub-ranges between the foregoing values. In other embodiments, the potassium DOL of each of the first and second compressive layers 120, 122 is from greater than or equal to 6 μm to less than or equal to 30 μm, such as from greater than or equal to 10 μm to less than or equal to 30 μm, from greater than or equal to 15 μm to less than or equal to 30 μm, from greater than or equal to 20 μm to less than or equal to 30 μm, or from greater than or equal to 25 μm to less than or equal to 30 μm, and all ranges and sub-ranges between the foregoing values. In yet other embodiments, the potassium DOL of each of the first and second compressive layers 120, 122 is from greater than or equal to 5 μm to less than or equal to 25 μm, such as from greater than or equal to 5 μm to less than or equal to 20 μm, from greater than or equal to 5 μm to less than or equal to 15 μm, or from greater than or equal to 5 μm to less than or equal to 10 μm, and all ranges and sub-ranges between the foregoing values.

The compressive stress of both major surfaces (110, 112 in FIG. 1) is balanced by stored tension in the central region (130) of the glass. The maximum central tension (CT) and DOC values are measured using a scattered light polariscope (SCALP) technique known in the art. The Refracted near-field (RNF) method or SCALP may be used to measure the stress profile. When the RNF method is utilized to measure the stress profile, the maximum CT value provided by SCALP is utilized in the RNF method. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. The RNF method includes placing the glass article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

In embodiments, the glass-based article may have a maximum CT greater than or equal to 95 MPa, such as greater than or equal to 100 MPa, greater than or equal to 105 MPa, greater than or equal to 110 MPa, greater than or equal to 110 MPa, greater than or equal to 120 MPa, greater than or equal to 130 MPa, greater than or equal to 140 MPa, or greater than or equal to 150 MPa, or more. In some embodiments, the glass-based article may have a maximum CT less than or equal to 200 MPa, such as less than or equal to 190 MPa, less than or equal to 180 MPa, less than or equal to 170 MPa, less than or equal to 160 MPa, less than or equal to 150 MPa, less than or equal to 140 MPa, less than or equal to 130 MPa, less than or equal to 120 MPa, less than or equal to 110 MPa, or less than or equal to 100 MPa. It should be understood that, in embodiments, any of the above ranges may be combined with any other range. However, in other embodiments, the glass article may have a maximum CT from greater than or equal to 95 MPa to less than or equal to 200 MPa, such as from greater than or equal to 100 MPa to less than or equal to 190 MPa, from greater than or equal to 110 MPa to less than or equal to 180 MPa, from greater than or equal to 120 MPa to less than or equal to 170 MPa, from greater than or equal to 130 MPa to less than or equal to 160 MPa, or from greater than or equal to 140 MPa to less than or equal to 150 MPa, and all ranges and sub-ranges between the foregoing values.

The maximum central tension (CT) may also be described with reference to the thickness of the glass-based article. In embodiments, the glass-based article may have a maximum CT less than or equal to $120/\sqrt{(t)}$ MPa where t is in mm, such as less than or equal to $110/\sqrt{(t)}$ MPa, less than or equal to $110/\sqrt{(t)}$ MPa, less than or equal to $100/\sqrt{(t)}$ MPa, less than or equal to $90/\sqrt{(t)}$ MPa, less than or equal to $80/\sqrt{(t)}$ MPa, less than or equal to $70/\sqrt{(t)}$ MPa, less than or equal to $60/\sqrt{(t)}$ MPa, less than or equal to $50/\sqrt{(t)}$ MPa, less than or equal to $40/\sqrt{(t)}$ MPa, less than or equal to $30/\sqrt{(t)}$ MPa, less than or equal to $20/\sqrt{(t)}$ MPa, less than or equal to $10/\sqrt{(t)}$ MPa, or less. In embodiments, the glass-based article may have a maximum CT less than or equal to $120/\sqrt{(t)}$ MPa where t is in mm, such as less than or equal to $110/\sqrt{(t)}$ MPa, less than or equal to $110/\sqrt{(t)}$ MPa, less than or equal to $100/\sqrt{(t)}$ MPa, less than or equal to $90/\sqrt{(t)}$ MPa, less than or equal to $80/\sqrt{(t)}$ MPa, less than or equal to $70/\sqrt{(t)}$ MPa, less than or equal to $60/\sqrt{(t)}$ MPa, less than or equal to $50/\sqrt{(t)}$ MPa, less than or equal to $40/\sqrt{(t)}$ MPa, less than or equal to $30/\sqrt{(t)}$ MPa, less than or equal to $20/\sqrt{(t)}$ MPa, less than or equal to $10/\sqrt{(t)}$ MPa, or less. In embodiments, the glass-based article may have a maximum CT greater than or equal to $10/\sqrt{(t)}$ MPa where t is in mm, such as greater than or equal to $20/\sqrt{(t)}$ MPa, greater than or equal to $30/\sqrt{(t)}$ MPa, greater than or equal to $40/\sqrt{(t)}$ MPa, greater than or equal to $50/\sqrt{(t)}$ MPa, greater than or equal to $60/\sqrt{(t)}$ MPa, greater than or equal to $70/\sqrt{(t)}$ MPa, greater than or equal to $80/\sqrt{(t)}$ MPa, greater than or equal to $90/\sqrt{(t)}$ MPa, greater than or equal to $100/\sqrt{(t)}$ MPa, greater than or equal to $110/\sqrt{(t)}$ MPa, or more. In embodiments, the glass-based article may have a maximum CT from greater than or equal to $10/\sqrt{(t)}$ MPa to less than or equal to $120/\sqrt{(t)}$ MPa where t is in mm, such as from greater than or equal to $20/\sqrt{(t)}$ MPa to less than or equal to $110/\sqrt{(t)}$ MPa, from greater than or equal to $30/\sqrt{(t)}$ MPa to less than or equal to $100/\sqrt{(t)}$ MPa, from greater than or equal to $40/\sqrt{(t)}$ MPa to less than or equal to $90/\sqrt{(t)}$ MPa, from greater than or equal to $50/\sqrt{(t)}$ MPa to less than or equal to $80/\sqrt{(t)}$ MPa, from greater than or equal to $60/\sqrt{(t)}$ MPa to less than or equal to $70/\sqrt{(t)}$ MPa, and all ranges and sub-ranges between the foregoing values.

The glass-based articles may have any appropriate depth of compression (DOC). In embodiments, the DOC is from greater than or equal to 75 μm to less than or equal to 300 μm, such as from greater than or equal to 85 μm to less than or equal to 290 μm, from greater than or equal to 95 μm to less than or equal to 280 μm, from greater than or equal to 100 μm to less than or equal to 270 μm, from greater than or equal to 110 μm to less than or equal to 260 μm, from greater than or equal to 120 μm to less than or equal to 250 μm, from greater than or equal to 130 μm to less than or equal to 240 μm, from greater than or equal to 140 μm to less than or equal to 230 μm, from greater than or equal to 150 μm to less than or equal to 220 μm, from greater than or equal to 160 μm to less than or equal to 210 μm, from greater than or equal to 170 μm to less than or equal to 200 μm, from greater than or equal to 180 am to less than or equal to 190 μm, and all ranges and sub-ranges between the foregoing values.

The DOC is provided in some embodiments herein as a portion of the thickness (t) of the glass-based article. In embodiments, the glass articles may have a depth of compression (DOC) from greater than or equal to 0.15 t to less than or equal to 0.40 t, such as from greater than or equal to 0.18 t to less than or equal to 0.38 t, or from greater than or equal to 0.19 t to less than or equal to 0.36 t, from greater than or equal to 0.20 t to less than or equal to 0.34 t, from greater than or equal to 0.18 t to less than or equal to 0.32 t, from greater than or equal to 0.19 t to less than or equal to 0.30 t, from greater than or equal to 0.20 t to less than or equal to 0.29 t, from greater than or equal to 0.21 t to less than or equal to 0.28 t, from greater than or equal to 0.22 t to less than or equal to 0.27 t, from greater than or equal to 0.23 t to less than or equal to 0.26 t, or from greater than or equal to 0.24 t to less than or equal to 0.25 t, and all ranges and sub-ranges between the foregoing values.

The glass-based articles described herein may exhibit a stored tensile energy (STE) in any appropriate amount. In embodiments, the glass-based articles may have a STE greater than or equal to 5 Pa·m, such as greater than or equal to 6 Pa·m, greater than or equal to 7 Pa·m, greater than or equal to 8 Pa·m, greater than or equal to 9 Pa·m, greater than or equal to 10 Pa·m, greater than or equal to 11 Pa·m, greater than or equal to 12 Pa·m, greater than or equal to 13 Pa·m, greater than or equal to 14 Pa·m, greater than or equal to 15 Pa·m, greater than or equal to 16 Pa·m, greater than or equal to 17 Pa·m, greater than or equal to 18 Pa·m, greater than or equal to 19 Pa·m, greater than or equal to 20 Pa·m, greater than or equal to 21 Pa·m, greater than or equal to 22 Pa·m, greater than or equal to 23 Pa·m, greater than or equal to 24 Pa·m, greater than or equal to 25 Pa·m, greater than or equal to 26 Pa·m, greater than or equal to 27 Pa·m, greater than or equal to 28 Pa·m, greater than or equal to 29 Pa·m, or more. In embodiments, the glass-based articles may have a STE less than or equal to 30 Pa·m, such as less than or equal to 29 Pa·m, less than or equal to 28 Pa·m, less than or equal to 27 Pa·m, less than or equal to 26 Pa·m, less than or equal to 25 Pa·m, less than or equal to 24 Pa·m, less than or equal to 23 Pa·m, less than or equal to 22 Pa·m, less than or equal to 21 Pa·m, less than or equal to 20 Pa·m, less than or equal to 19 Pa·m, less than or equal to 18 Pa·m, less than or equal to 17 Pa·m, less than or equal to 16 Pa·m, less than or equal to 15 Pa·m, less than or equal to 14 Pa·m, less than or equal to 13 Pa·m, less than or equal to 12 Pa·m, less than or equal to 11 Pa·m, less than or equal to 10 Pa·m, less than or equal to 9 Pa·m, less than or equal to 8 Pa·m, less than or equal to 7 Pa·m, less than or equal to 6 Pa·m, less than or equal to 5 Pa·m, or less. In embodiments, the glass-based articles may have a STE from greater than or equal to 5 Pa·m to less than or equal to 30 Pa·m, such as greater than or equal to 6 Pa·m to less than or equal to 29 Pa·m, greater than or equal to 7 Pa·m to less than or equal to 28 Pa·m, greater than or equal to 8 Pa·m to less than or equal to 27 Pa·m, greater than or equal to 8 Pa·m to less than or equal to 26 Pa·m, greater than or equal to 9 Pa·m to less than or equal to 25 Pa·m, greater than or equal to 10 Pa·m to less than or equal to 24 Pa·m, greater than or equal to 11 Pa·m to less than or equal to 23 Pa·m, greater than or equal to 12 Pa·m to less than or equal to 23 Pa·m, greater than or equal to 13 Pa·m to less than or equal to 22 Pa·m, greater than or equal to 14 Pa·m to less than or equal to 21 Pa·m, greater than or equal to 15 Pa·m to less than or equal to 20 Pa·m, greater than or equal to 16 Pa·m to less than or equal to 19 Pa·m, greater than or equal to 17 Pa·m to less than or equal to 18 Pa·m, and all ranges and sub-ranges between the foregoing values.

As utilized herein, the stored tensile energy (STE) of the glass-based articles is calculated using the following equation (IV):

$$STE(Pa \cdot m) = [1-v]/E \int \sigma(z)^2 dz$$

where v is Poisson's ratio, E is the Young's modulus, $\sigma(z)$ is the stress as a function of position (z) in the thickness direction, and the integration is performed over the tensile region only. Equation (IV) is described in Suresh T. Gulati, *Frangibility of Tempered Soda-Lime Glass Sheet*, GLASS PROCESSING DAYS, The Fifth International Conference on Architectural and Automotive Glass, 13-15 Sep. 1997, as equation number 4. The Poisson's ratio values recited in this disclosure refer to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

The glass-based articles may be formed by exposing glass-based substrates to an ion exchange solution to form a glass-based article having a compressive stress layer extending from a surface of the glass-based article to a depth of compression. The ion exchange process may be conducted under conditions sufficient to produce a glass-based article satisfying any of formulas (I), (IA), and (II). In embodiments, the ion exchange solution may be molten nitrate salt. In some embodiments, the ion exchange solution may be molten $KNO_3$, molten $NaNO_3$, or combinations thereof. In certain embodiments, the ion exchange solution may comprise less than about 95% molten $KNO_3$, such as less than about 90% molten $KNO_3$, less than about 80% molten $KNO_3$, less than about 70% molten $KNO_3$, less than about 60% molten $KNO_3$, or less than about 50% molten $KNO_3$. In certain embodiments, the ion exchange solution may comprise at least about 5% molten $NaNO_3$, such as at least about 10% molten $NaNO_3$, at least about 20% molten $NaNO_3$, at least about 30% molten $NaNO_3$, or at least about 40% molten $NaNO_3$. In other embodiments, the ion exchange solution may comprise about 95% molten $KNO_3$ and about 5% molten $NaNO_3$, about 94% molten $KNO_3$ and about 6% molten $NaNO_3$, about 93% molten $KNO_3$ and about 7% molten $NaNO_3$, about 80% molten $KNO_3$ and about 20% molten $NaNO_3$, about 75% molten $KNO_3$ and about 25% molten $NaNO_3$, about 70% molten $KNO_3$ and about 30% molten $NaNO_3$, about 65% molten $KNO_3$ and about 35% molten $NaNO_3$, or about 60% molten $KNO_3$ and about 40% molten $NaNO_3$, and all ranges and sub-ranges between the foregoing values. In embodiments, other sodium and potassium salts may be used in the ion exchange solution, such as, for example sodium or potassium nitrites, phosphates, or sulfates. In some embodiments, the ion exchange solution may include lithium salts, such as $LiNO_3$.

The glass-based substrate may be exposed to the ion exchange solution by dipping the glass-based substrate into a bath of the ion exchange solution, spraying the ion exchange solution onto the glass-based substrate, or otherwise physically applying the ion exchange solution to the glass-based substrate. Upon exposure to the glass-based substrate, the ion exchange solution may, according to embodiments, be at a temperature from greater than or equal to 340° C. to less than or equal to 500° C., such as from greater than or equal to 350° C. to less than or equal to 490° C., from greater than or equal to 360° C. to less than or equal to 480° C., from greater than or equal to 370° C. to less than or equal to 470° C., from greater than or equal to 380° C. to less than or equal to 460° C., from greater than or equal to 390° C. to less than or equal to 450° C., from greater than or equal to 400° C. to less than or equal to 440° C., from greater than or equal to 410° C. to less than or equal to 430° C., equal to 420° C., and all ranges and sub-ranges between the foregoing values. In embodiments, the glass composition may be exposed to the ion exchange solution for a duration from greater than or equal to 2 hours to less than or equal to 48 hours, such as from greater than or equal to 4 hours to less than or equal to 44 hours, from greater than or equal to 8 hours to less than or equal to 40 hours, from greater than or equal to 12 hours to less than or equal to 36 hours, from greater than or equal to 16 hours to less than or equal to 32 hours, from greater than or equal to 20 hours to less than or equal to 28 hours, equal to 24 hours, and all ranges and sub-ranges between the foregoing values.

The ion exchange process may be performed in an ion exchange solution under processing conditions that provide an improved compressive stress profile as disclosed, for example, in U.S. Patent Application Publication No. 2016/0102011, which is incorporated herein by reference in its entirety. In some embodiments, the ion exchange process may be selected to form a parabolic stress profile in the glass articles, such as those stress profiles described in U.S. Patent Application Publication No. 2016/0102014, which is incorporated herein by reference in its entirety.

After an ion exchange process is performed, it should be understood that a composition at the surface of the glass-based article is different than the composition of the glass-based substrate before it undergoes an ion exchange process. This results from one type of alkali metal ion in the as-formed glass, such as, for example $Li^+$ or $Na^+$, being replaced with larger alkali metal ions, such as, for example $Na^+$ or $K^+$, respectively. However, the glass composition and phase assemblage at or near the center of the depth of the glass-based article will, in embodiments, still have the composition of the glass-based substrate.

The glass-based substrates that are ion exchanged to form the glass-based articles may have any appropriate composition, such as alkali aluminosilicate compositions. In embodiments, the glass-based substrates include $SiO_2$, $Al_2O_3$, $B_2O_3$, and at least one alkali metal oxide. The at least one alkali metal oxide facilitates the ion exchange of the glass-based substrates. For example, the glass-based substrate may include $Li_2O$ and/or $Na_2O$ that facilitate the exchange of $Na^+$ and $K^+$ ions into the glass-based substrate to form the glass-based articles. As discussed above, the composition of the glass-based substrates may be equivalent to the composition and phase assemblage at the center of the glass-based article.

In embodiments of glass-based substrates described herein, the concentration of constituent components (e.g., $SiO_2$, $Al_2O_3$, $Li_2$, and the like) are given in mole percent (mol %) on an oxide basis, unless otherwise specified. Components of the glass-based substrate according to embodiments are discussed individually below. It should be understood that any of the variously recited ranges of one component may be individually combined with any of the variously recited ranges for any other component.

In embodiments of the glass-based substrates disclosed herein, $SiO_2$ is the largest constituent and, as such, $SiO_2$ is the primary constituent of the glass network formed from the glass composition. Pure $SiO_2$ has a relatively low CTE and is alkali free. However, pure $SiO_2$ has a high melting point. Accordingly, if the concentration of $SiO_2$ in the glass-based substrate is too high, the formability of the glass composition may be diminished as higher concentrations of $SiO_2$ increase the difficulty of melting the glass, which, in turn, adversely impacts the formability of the glass. In embodiments, the glass-based substrate generally comprises $SiO_2$ in an amount from greater than or equal to 50.0 mol % to less than or equal to 69.0 mol %, and all ranges and sub-ranges between the foregoing values. In embodiments, the glass-based substrate comprises $SiO_2$ in an amount from greater than or equal to 51.0 mol % to less than or equal to 68.0 mol %, such as from greater than or equal to 52.0 mol % to less than or equal to 67.0 mol %, from greater than or equal to 53.0 mol % to less than or equal to 66.0 mol %, from greater than or equal to 54.0 mol % to less than or equal to 65.0 mol %, from greater than or equal to 55.0 mol % to less than or equal to 64.0 mol %, from greater than or equal to 56.0 mol % to less than or equal to 63.0 mol %, from greater than or equal to 57.0 mol % to less than or equal to 62.0 mol %, from greater than or equal to 58.0 mol % to less than or equal to 61.0 mol %, or from greater than or equal to 60.0 mol % to less than or equal to 61.0 mol %, and all ranges and sub-ranges between the foregoing values.

The glass-based substrate of embodiments may further comprise $Al_2O_3$. $Al_2O_3$ may serve as a glass network former, similar to $SiO_2$. $Al_2O_3$ may increase the viscosity of the glass composition due to its tetrahedral coordination in a glass melt formed from a glass composition, decreasing the formability of the glass composition when the amount of $Al_2O_3$ is too high. However, when the concentration of $Al_2O_3$ is balanced against the concentration of $SiO_2$ and the concentration of alkali oxides in the glass-based substrate, $Al_2O_3$ can reduce the liquidus temperature of the glass melt, thereby enhancing the liquidus viscosity and improving the compatibility of the glass composition with certain forming processes, such as the fusion forming process. In embodiments, the glass-based substrate generally comprises $Al_2O_3$ in a concentration of from greater than or equal to 12.5 mol % to less than or equal to 25.0 mol %, and all ranges and sub-ranges between the foregoing values. In embodiments, the glass-based substrate comprises $Al_2O_3$ in an amount from greater than or equal to 13.0 mol % to less than or equal to 24.5 mol %, such as from greater than or equal to 13.5 mol % to less than or equal to 24.0 mol %, from greater than or equal to 14.0 mol % to less than or equal to 23.5 mol %, from greater than or equal to 14.5 mol % to less than or equal to 23.0 mol %, from greater than or equal to 15.0 mol % to less than or equal to 22.5 mol %, from greater than or equal to 15.5 mol % to less than or equal to 22.0 mol %, from greater than or equal to 16.0 mol % to less than or equal to 21.5 mol %, from greater than or equal to 16.5 mol % to less than or equal to 21.0 mol %, from greater than or equal to 17.0 mol % to less than or equal to 20.5 mol %, from greater than or equal to 17.5 mol % to less than or equal to 20.0 mol %, from greater than or equal to 18.0 mol % to less than or equal to 19.5 mol %, or from greater than or equal to 18.5 mol % to less than or equal to 19.0 mol %, and all ranges and sub-ranges between the foregoing values.

Like $SiO_2$ and $Al_2O_3$, $B_2O_3$ may be added to the glass-based substrate as a network former, thereby reducing the meltability and formability of the glass composition. Thus, $B_2O_3$ may be added in amounts that do not overly decrease these properties. In embodiments, the glass-based substrate may comprise $B_2O_3$ in amounts from greater than or equal to 0 mol % $B_2O_3$ to less than or equal to 8.0 mol % $B_2O_3$, and all ranges and sub-ranges between the foregoing values. In embodiments, the glass-based substrate comprises $B_2O_3$ in amounts from greater than or equal to 0.5 mol % to less than or equal to 7.5 mol %, such as greater than or equal to 1.0 mol % to less than or equal to 7.0 mol %, greater than or equal to 1.5 mol % to less than or equal to 6.5 mol %, greater than or equal to 2.0 mol % to less than or equal to 6.0 mol %, greater than or equal to 2.5 mol % to less than or equal to 5.5 mol %, greater than or equal to 3.0 mol % to less than or equal to 5.0 mol %, or greater than or equal to 3.5 mol % to less than or equal to 4.5 mol %, and all ranges and sub-ranges between the foregoing values.

The inclusion of $Li_2O$ in the glass-based substrate allows for better control of an ion exchange process and further reduces the softening point of the glass, thereby increasing the manufacturability of the glass. In embodiments, the glass-based substrate generally comprises $Li_2O$ in an amount from greater than 8.0 mol % to less than or equal to 18.0 mol %, and all ranges and sub-ranges between the foregoing values. In embodiments, the glass-based substrate comprises $Li_2$ in an amount from greater than or equal to 8.5 mol % to less than or equal to 17.5 mol %, such as from greater than or equal to 9.0 mol % to less than or equal to 17.0 mol %, from greater than or equal to 9.5 mol % to less than or equal to 16.5 mol %, from greater than or equal to 10.0 mol % to less than or equal to 16.0 mol %, from greater than or equal to 10.5 mol % to less than or equal to 15.5 mol %, from greater than or equal to 11.0 mol % to less than or equal to 15.0 mol %, from greater than or equal to 11.5 mol % to less than or equal to 14.5 mol %, from greater than or equal to 12.0 mol % to less than or equal to 14.0 mol %, or from greater than or equal to 12.5 mol % to less than or equal to 13.5 mol %, and all ranges and sub-ranges between the foregoing values.

According to embodiments, the glass-based substrate may also comprise alkali metal oxides other than $Li_2O$, such as $Na_2O$. $Na_2O$ aids in the ion exchangeability of the glass composition, and also improves the formability, and thereby manufacturability, of the glass composition. However, if too much $Na_2O$ is added to the glass-based substrate, the CTE may be too low, and the melting point may be too high. In embodiments, the glass-based substrate generally comprises $Na_2O$ in an amount from greater than or equal to 0.5 mol % $Na_2O$ to less than or equal to 8.0 mol % $Na_2O$, and all ranges and sub-ranges between the foregoing values. In embodiments, the glass-based substrate comprises $Na_2O$ in an amount from greater than or equal to 1.0 mol % to less than or equal to 7.5 mol %, such as from greater than or equal to 1.5 mol % to less than or equal to 7.0 mol %, from greater than or equal to 2.0 mol % to less than or equal to 6.5 mol %, from greater than or equal to 2.5 mol % to less than or equal to 6.0 mol %, from greater than or equal to 3.0 mol % to less than or equal to 5.5 mol %, from greater than or equal to 3.5 mol % to less than or equal to 5.0 mol %, or from greater than or equal to 4.0 mol % to less than or equal to 4.5 mol %, and all ranges and sub-ranges between the foregoing values.

Like $Na_2$, $K_2O$ also promotes ion exchange and increases the DOC of a compressive stress layer. However, adding $K_2O$ may cause the CTE may be too low, and the melting point may be too high. In some embodiment, the glass-based substrate can include $K_2O$. In embodiments, the glass composition is substantially free of potassium. As used herein, the term "substantially free" means that the component is not added as a component of the batch material even though the component may be present in the final glass in very small amounts as a contaminant, such as less than 0.01 mol %. In other embodiments, $K_2O$ may be present in the glass-based substrate in amounts less than 1 mol %.

MgO lowers the viscosity of a glass, which enhances the formability and manufacturability of the glass. The inclusion of MgO in the glass-based substrate also improves the strain point and the Young's modulus of the glass composition, and may also improve the ion exchange ability of the glass. However, when too much MgO is added to the glass composition, the density and the CTE of the glass composition increase undesirably. In embodiments, the glass-based substrate generally comprises MgO in a concentration of from greater than 0 mol % to less than or equal to 17.5 mol %, and all ranges and sub-ranges between the foregoing values. In embodiments, the glass-based substrate comprises MgO in an amount from greater than or equal to 0.5 mol % to less than or equal to 17.0 mol %, such as from greater than or equal to 1.0 mol % to less than or equal to 16.5 mol %, from greater than or equal to 1.5 mol % to less than or equal to 16.0 mol %, from greater than or equal to 2.0 mol % to less than or equal to 15.5 mol %, from greater than or equal to 2.5 mol % to less than or equal to 15.0 mol %, from greater than or equal to 3.0 mol % to less than or equal to 14.5 mol %, from greater than or equal to 3.5 mol % to less than or equal to 14.0 mol %, from greater than or equal to 4.0 mol % to less than or equal to 13.5 mol %, from greater than or equal to 4.5 mol % to less than or equal to 13.0 mol %, from greater than or equal to 5.0 mol % to less than or equal to 12.5 mol %, from greater than or equal to 5.5 mol % to less than or equal to 12.0 mol %, from greater than or equal to 6.0 mol % to less than or equal to 11.5 mol %, from greater than or equal to 6.5 mol % to less than or equal to 11.0 mol %, from greater than or equal to 7.0 mol % to less than or equal to 10.5 mol %, from greater than or equal to 7.5 mol % to less than or equal to 10.0 mol %, from greater than or equal to 8.0 mol % to less than or equal to 9.5 mol %, or from greater than or equal to 8.5 mol % to less than or equal to 9.0 mol %, and all ranges and sub-ranges between the foregoing values.

CaO lowers the viscosity of a glass, which enhances the formability, the strain point and the Young's modulus, and may improve the ion exchange ability. However, when too much CaO is added to the glass-based substrate, the density and the CTE of the glass composition increase. In embodiments, the glass-based substrate generally comprises CaO in a concentration of from greater than 0 mol % to less than or equal to 4.0 mol %, and all ranges and sub-ranges between the foregoing values. In embodiments, the glass-based substrate comprises CaO in an amount from greater than or equal to 0.5 mol % to less than or equal to 3.5 mol %, such as from greater than or equal to 1.0 mol % to less than or equal to 3.0 mol %, or from greater than or equal to 1.5 mol % to less than or equal to 2.5 mol %, and all ranges and sub-ranges between the foregoing values.

$La_2O_3$ increases the toughness of the glass, and also increases the Young's modulus and hardness of the glass. However, when too much $La_2O_3$ is added to the glass composition, the glass becomes susceptible to devitrification and the manufacturability of the glass is decreased. In embodiments, the glass-based substrate generally comprises $La_2O_3$ in a concentration of from greater than or equal to 0 mol % to less than or equal to 2.5 mol %, and all ranges and sub-ranges between the foregoing values. In embodiments, the glass-based substrate comprises $La_2O_3$ in an amount from greater than or equal to 0.5 mol % to less than or equal to 2.0 mol %, such as from greater than or equal to 1.0 mol % to less than or equal to 1.5 mol %, and all ranges and sub-ranges between the foregoing values. In some embodiments, the glass composition is free or substantially free of $La_2O_3$.

$Y_2O_3$ also increases the toughness of the glass, and increases the Young's modulus and hardness of the glass. However, when too much $Y_2O_3$ is added to the glass composition, the glass becomes susceptible to devitrification and the manufacturability of the glass is decreased. In embodiments, the glass-based substrate comprises $Y_2O_3$, such as in a concentration of from greater than or equal to 0 mol % to less than or equal to 2.0 mol %, and all ranges and sub-ranges between the foregoing values. In embodiments, the glass-based substrate comprises $Y_2O_3$ in an amount from greater than or equal to 0.5 mol % to less than or equal to 1.5 mol %. In some embodiments, the glass-based substrate is free or substantially free of $Y_2O_3$.

$TiO_2$ also contributes to the increased toughness of the glass, while also simultaneously softening the glass. However, when too much $TiO_2$ is added to the glass composition, the glass becomes susceptible to devitrification and exhibits an undesirable coloration. In embodiments, the glass-based substrate comprises $TiO_2$, such as in a concentration of from greater than or equal to 0 mol % to less than or equal to 2.0 mol %, and all ranges and sub-ranges between the foregoing values. In embodiments, the glass-based substrate comprises $TiO_2$ in an amount from greater than or equal to 0.5 mol % to less than or equal to 1.5 mol %. In some embodiments, the glass-based substrate is free or substantially free of $TiO_2$.

$ZrO_2$ contributes to the toughness of the glass. However, when too much $ZrO_2$ is added to the glass composition, undesirable zirconia inclusions may be formed in the glass due at least in part to the low solubility of $ZrO_2$ in the glass. In embodiments, the glass-based substrate comprises $ZrO_2$, such as in a concentration of from greater than or equal to 0 mol % to less than or equal to 2.5 mol %, and all ranges and sub-ranges between the foregoing values. In embodiments, the glass-based substrate comprises $ZrO_2$ in an amount from greater than or equal to 0.5 mol % to less than or equal to 2.0 mol %, such as from greater than or equal to 1.0 mol % to less than or equal to 1.5 mol %, and all ranges and sub-ranges between the foregoing values. In some embodiments, the glass-based substrate is free or substantially free of $ZrO_2$.

SrO lowers the liquidus temperature of glass compositions disclosed herein. In embodiments, the glass-based substrate may comprise SrO in amounts from greater than or equal to 0 mol % to less than or equal to 1.0 mol %, such as from greater than or equal to 0.2 mol % to less than or equal to 0.8 mol %, or from greater than or equal to 0.4 mol % to less than or equal to 0.6 mol %, and all ranges and sub-ranges between the foregoing values. In some embodiments, the glass-based substrate may be substantially free or free of SrO.

In embodiments, the glass-based substrate may optionally include one or more fining agents. In some embodiments, the fining agents may include, for example, $SnO_2$. In such embodiments, $SnO_2$ may be present in the glass-based substrate in an amount less than or equal to 0.2 mol %, such as from greater than or equal to 0 mol % to less than or equal to 0.1 mol %, and all ranges and sub-ranges between the foregoing values. In other embodiments, $SnO_2$ may be present in the glass-based substrate in an amount from greater than or equal to 0 mol % to less than or equal to 0.2 mol %, or greater than or equal to 0.1 mol % to less than or equal to 0.2 mol %, and all ranges and sub-ranges between the foregoing values. In some embodiments, the glass-based substrate may be substantially free or free of $SnO_2$.

In embodiments, the glass-based substrate may be substantially free of one or both of arsenic and antimony. In other embodiments, the glass-based substrate may be free of one or both of arsenic and antimony.

In one or more embodiments, the glass articles described herein may exhibit an amorphous microstructure and may be substantially free of crystals or crystallites. In other words, the glass articles exclude glass-ceramic materials in some embodiments.

The glass-based substrate may include a glass ceramic. The glass ceramic is characterized by a phase assemblage, the phase assemblage including an amorphous phase and at least one crystalline phase. The crystalline phase(s) of the glass ceramic may include any appropriate crystal structure, such as a lithium silicate, beta-spodumene, or spinel crystal structures. The glass ceramic containing glass-based substrates may be formed by any appropriate method, such as ceramming a precursor glass.

The glass-based substrates may be produced by any appropriate method. In embodiments, the glass-based substrates may be formed by process including slot forming, float forming, rolling processes, and fusion forming processes. Drawing processes for forming glass-based substrates, are desirable because they allow a thin glass article to be formed with few defects.

The glass-based substrates may be characterized by the manner in which it may be formed. For instance, the glass-based substrate may be characterized as float-formable (i.e., formed by a float process), down-drawable and, in particular, fusion-formable or slot-drawable (i.e., formed by a down draw process such as a fusion draw process or a slot draw process).

Some embodiments of the glass-based articles described herein may be formed by a down-draw process. Down-draw processes produce glass-based substrates having a uniform thickness that possess relatively pristine surfaces. Because the average flexural strength of the glass-based substrate and resulting glass-based article is controlled by the amount and size of surface flaws, a pristine surface that has had minimal contact has a higher initial strength. In addition, down drawn glass-based substrates have a very flat, smooth surface that can be used in its final application without costly grinding and polishing.

Some embodiments of the glass-based substrates may be described as fusion-formable (i.e., formable using a fusion draw process). The fusion process uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films.

These outside surfaces of the drawing tank extend down and inwardly so that they join at an edge below the drawing tank. The two flowing glass films join at this edge to fuse and form a single flowing glass article. The fusion draw method offers the advantage that, because the two glass films flowing over the channel fuse together, neither of the outside surfaces of the resulting glass-based substrate comes in contact with any part of the apparatus. Thus, the surface properties of the fusion drawn glass-based substrate are not affected by such contact.

Some embodiments of the glass-based substrates described herein may be formed by a slot draw process. The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass-based substrate and into an annealing region.

Figure 3A:
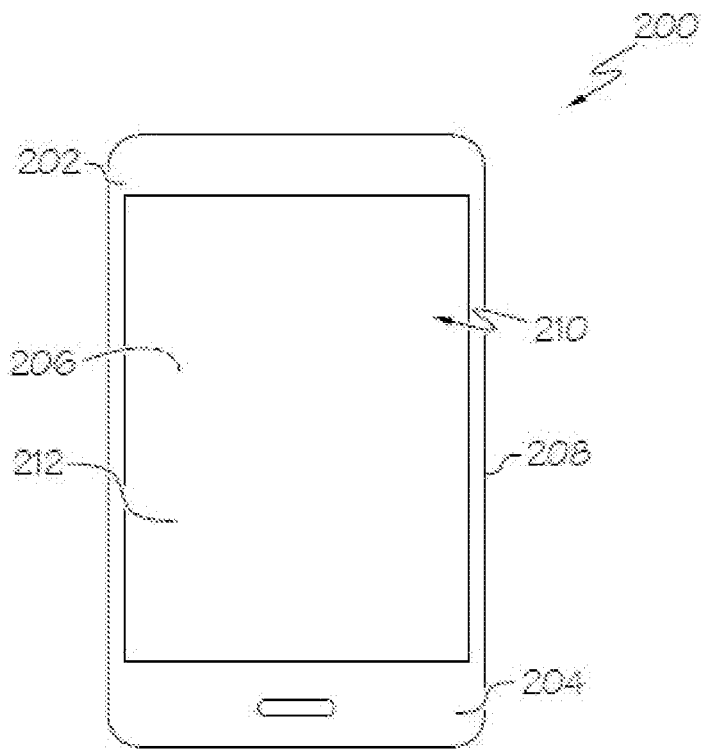
FIG. 3A is a plan view of an exemplary electronic device incorporating any of the glass-based articles disclosed herein.
Figure 3B:
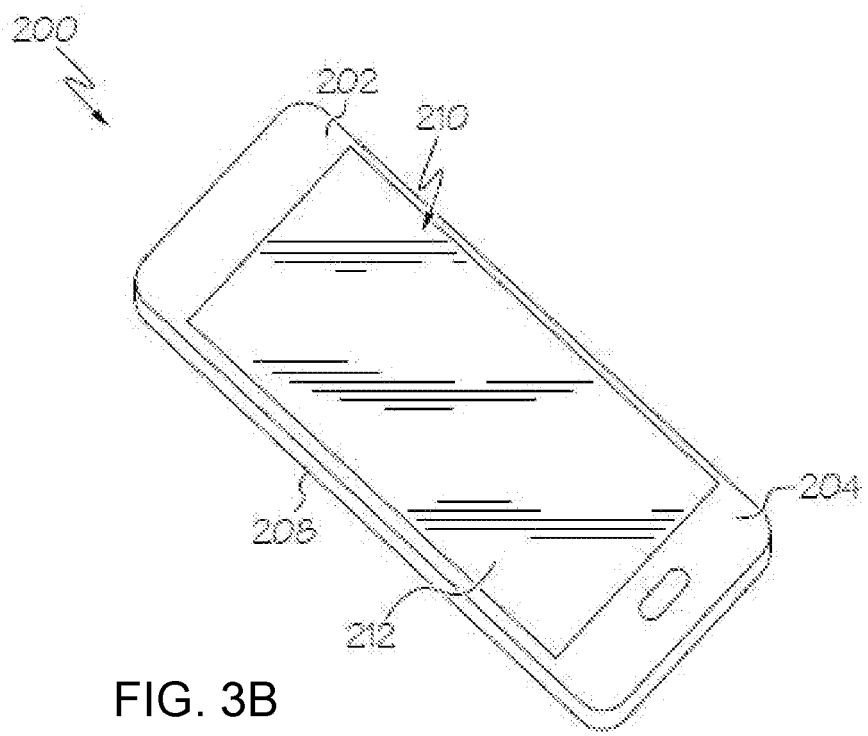
FIG. 3B is a perspective view of the exemplary electronic device of FIG. 3A.

The glass-based articles disclosed herein may be incorporated into another article such as an article with a display (or display articles) (e.g., consumer electronics, including mobile phones, tablets, computers, navigation systems, and the like), architectural articles, transportation articles (e.g., automobiles, trains, aircraft, sea craft, etc.), appliance articles, or any article that requires some transparency, scratch-resistance, abrasion resistance or a combination thereof. An exemplary article incorporating any of the glass-based articles disclosed herein is shown in FIGS. 3A and 3B. Specifically, FIGS. 3A and 3B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover substrate 212 at or over the front surface of the housing such that it is over the display. The cover substrate 212 and/or the housing may include any of the glass-based articles disclosed herein.

EXAMPLES

Embodiments will be further clarified by the following examples. It should be understood that these examples are not limiting to the embodiments described above.

Glass-based articles with the compositions in Table I below were prepared, the concentrations of the components are provided in mol %. Example 1 was cerammed to form a glass ceramic. The glass-based substrates had a thickness of 0.8 mm.

TABLE 1

|  | A | B | C | D | 1 | 2 | 3 |
|---|---|---|---|---|---|---|---|
| $SiO_2$ | 57.43 | 63.64 | 63.31 | 70.94 | 70.29 | 54.52 | 58.09 |
| $Al_2O_3$ | 16.10 | 15.07 | 15.20 | 12.83 | 4.23 | 19.43 | 18.04 |
| $B_2O_3$ |  | 2.34 | 6.74 | 1.86 |  | 7.91 | 6.05 |
| $P_2O_5$ | 6.54 | 2.53 |  |  | 0.87 |  |  |
| $Li_2O$ |  | 5.93 | 6.82 | 8.22 | 21.35 | 11.70 | 11.36 |
| $Na_2O$ | 17.05 | 9.27 | 4.30 | 2.36 | 1.51 | 1.90 | 1.92 |
| $ZrO_2$ |  |  |  |  | 1.67 |  |  |
| CaO |  |  | 1.55 |  |  | 0.07 | 0.04 |
| $K_2O$ |  |  |  |  |  | 0.05 |  |

TABLE 1-continued

| | A | B | C | D | 1 | 2 | 3 |
|---|---|---|---|---|---|---|---|
| MgO | 2.81 | | 1.00 | 2.87 | | 4.35 | 4.41 |
| $SnO_2$ | 0.07 | 0.05 | 0.05 | 0.06 | 0.08 | 0.04 | 0.05 |
| $TiO_2$ | | | | | | | |
| ZnO | | 1.17 | | 0.83 | | | |
| SrO | | | 1.02 | | | | |
| $Fe_2O_3$ | | | | 0.02 | | | |

The glass-based substrates were then ion exchanged to produce glass-based articles. The properties of the glass-based substrates and the glass-based articles are provided in Table 2 below. The Young's modulus (E), hardness (H), and fracture toughness ($K_{IC}$) were measured on glass-based substrates before being ion exchanged to form the glass-based articles. To measure the drop performance, the glass-based articles were loaded into a puck simulating a smart phone and dropped onto 30 grit sandpaper, the drop performance is reported in terms of the maximum drop height in cm before failure of the glass-based article.

TABLE 2

| | A | B | C | D | 1 | 2 | 3 |
|---|---|---|---|---|---|---|---|
| $K_{IC}$ (MPa√m) | 0.65 | 0.75 | 0.87 | 0.84 | 1.34 | 0.96 | 0.95 |
| E (Gpa) | 65 | 74 | 77 | 80 | 110 | | |
| H (Gpa) | 4.802 | 5.253 | 5.733 | 5.929 | 7.428 | | |
| DOC (m) | 0.0001 | 0.00016 | 0.00017 | 0.000175 | 0.00015 | 0.00019 | 0.00019 |
| DOC/t | 0.13 | 0.20 | 0.21 | 0.22 | 0.19 | 0.24 | 0.24 |
| STE (Pa·m) | 18 | 12 | 17 | 20 | 8 | 24 | 24 |
| $K_{IC}^2$ * DOC/ t * √(STE) ($Pa^{2.5}m^{1.5}$) | 2.24 × $10^{11}$ | 3.90 × $10^{11}$ | 6.63 × $10^{11}$ | 6.90 × $10^{11}$ | 9.52 × $10^{11}$ | 1.07 × $10^{12}$ | 1.05 × $10^{12}$ |
| $K_{IC}^2$ * DOC * H/ E * √(STE) ($Pa^{2.5}m^{2.5}$) | 13242554 | 22130554 | 39500547 | 40926356 | 54876097 | | |
| Drop Performance (cm) | 35 | 84 | 135 | 129 | 182 | 177 | 188 |

Figure 4:
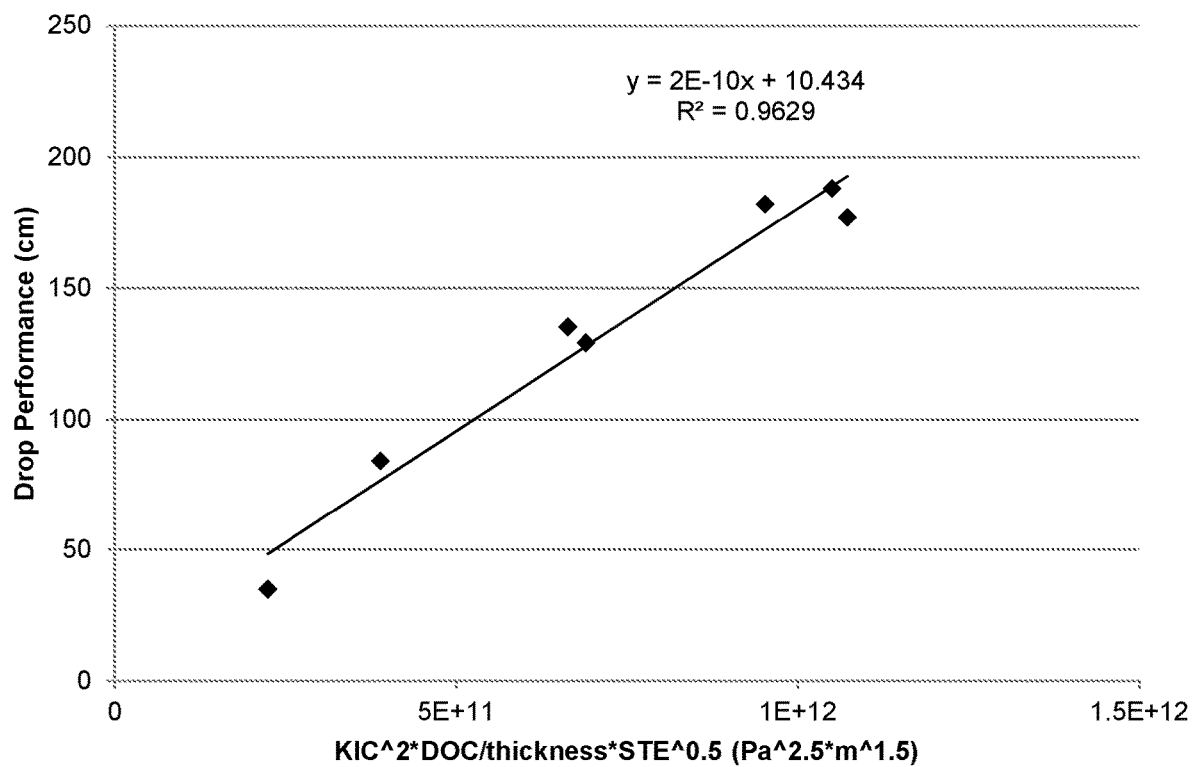
FIG. 4 is a plot of drop performance as a function of formula (I) values for various comparative examples and embodiments.
Figure 5:
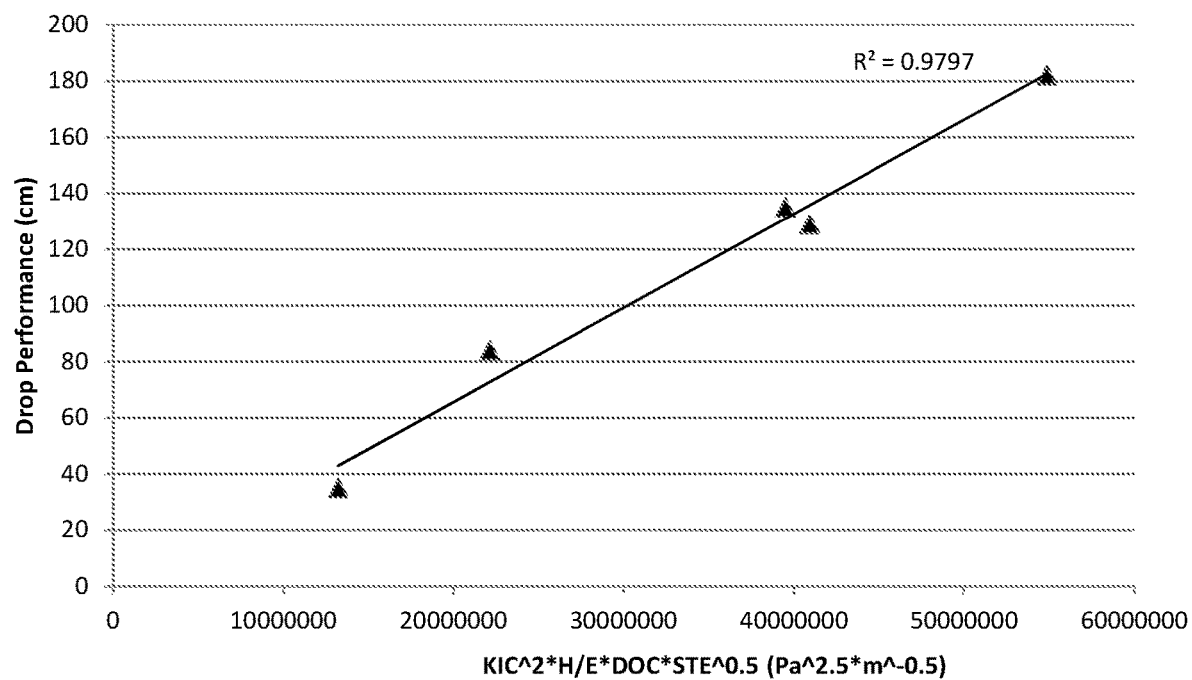
FIG. 5 is a plot of drop performance as a function of formula (II) values for various comparative examples and embodiments.

The relationship between the drop performance and the formula (I) values is shown in FIG. 4. The relationship between the drop performance and the formula (II) values is shown in FIG. 5. As demonstrated by FIGS. 4 and 5, glass-based articles satisfying formulas (I) and (II) exhibit improved drop performance. As demonstrated in FIGS. 4 and 5, Examples 1-3 which satisfy formulas (I) and (II) all exhibited better drop performance than Comparative Examples A-D which did not satisfy formulas (I) and (II).

All ranges disclosed in this specification include any and all ranges and subranges encompassed by the broadly disclosed ranges whether or not explicitly stated before or after a range is disclosed.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A method of measuring fracture toughness of glass, comprising:
    sub-critically growing a crack in a sample of a glass until a ratio of crack length to half of a width of the sample is greater than 1.5;
    after sub-critically growing the crack, pinning the crack;
    after pinning the crack, fracturing the sample by increasing load on the sample until failure; and
    calculating fracture toughness of the glass as a function of the load at failure and dimensions of the sample.

2. The method of claim 1, wherein the pinning comprises wicking an agent into the crack along a length of the crack.

3. The method of claim 2, wherein the agent is toluene.

4. The method of claim 1, wherein the sample is rectangular.

5. The method of claim 4, wherein a first thickness of the sample is between 0.3 mm and 1 mm.

6. The method of claim 5, wherein the sample comprises a web having a second thickness less than the first thickness.

7. The method of claim 6, wherein the second thickness is approximately half the first thickness.

8. The method of claim 7, wherein the dimensions used in calculating the fracture toughness include the first and second thicknesses.

9. The method of claim 8, wherein the fracture toughness is calculated by calculating applied stress intensity of the glass.

10. The method of claim 1, further comprising monitoring the crack.

11. The method of claim 10, wherein the monitoring includes using a microscope attached to a digital camera and computer.

12. The method of claim 1, wherein the sample comprises a guiding groove down a length of the sample.

13. The method of claim 12, wherein the sample has two major surfaces, and the guiding groove extends down both major surfaces and forms a web.

14. The method of claim 13, further comprising cutting an initial crack through the web and within the guiding groove.

15. The method of claim 14, wherein the cutting of the initial crack comprises using a dicing saw.

16. The method of claim 15, wherein the initial crack includes a wedge formed by curvature of the dicing saw.

17. A method of measuring fracture toughness of glass, comprising:
- cutting an initial crack through a web and within a guiding groove of a sample of glass, wherein the sample is rectangular, a first thickness of the sample is between 0.3 mm and 1 mm, the sample has two major surfaces, the guiding groove extends down a length of the sample and down both major surfaces to form the web, wherein the web has a second thickness that is less than the first thickness,
- sub-critically growing a crack in the sample, wherein the crack is sub-critically grown until a ratio of crack length to half of a width of the sample is greater than 1.5;
- after sub-critically growing the crack, pinning the crack, wherein the pinning comprises wicking an agent into the crack along a length of the crack, wherein the agent is toluene;
- after pinning the crack, fracturing the sample by increasing load on the sample until failure; and
- calculating fracture toughness of the glass as a function of the load at failure and dimensions of the sample, wherein the dimensions used in calculating the fracture toughness include the first and second thicknesses, wherein the fracture toughness is calculated by calculating applied stress intensity of the glass.

18. The method of claim 17, wherein the cutting of the initial crack comprises using a dicing saw.

19. The method of claim 18, wherein the initial crack includes a wedge formed by curvature of the dicing saw.

20. A method of measuring fracture toughness of glass, comprising:
- cutting an initial crack through a web and within a guiding groove of a sample of glass, wherein the sample is rectangular, a first thickness of the sample is between 0.3 mm and 1 mm, the sample has two major surfaces, the guiding groove extends down a length of the sample and down both major surfaces to form the web, wherein the web has a second thickness that is less than the first thickness,
- sub-critically growing a crack in the sample;
- after sub-critically growing the crack, pinning the crack, wherein the pinning comprises wicking an agent into the crack along a length of the crack, wherein the agent is toluene;
- after pinning the crack, fracturing the sample by increasing load on the sample until failure; and
- calculating fracture toughness of the glass as a function of the load at failure and dimensions of the sample, wherein the dimensions used in calculating the fracture toughness include the first and second thicknesses, wherein the fracture toughness is calculated by calculating applied stress intensity of the glass.

\* \* \* \* \*

UNITED STATES PATENT AND TRADEMARK OFFICE
CERTIFICATE OF CORRECTION

PATENT NO. : 11,112,833 B2
APPLICATION NO. : 17/179541
DATED : September 7, 2021
INVENTOR(S) : Emily Marie Aaldenberg et al.

It is certified that error appears in the above-identified patent and that said Letters Patent is hereby corrected as shown below:

On the Title Page

In Column 2, item (56), Other Publications, Line 2, delete "Na2O-TiO2-SiO2" and insert -- $Na_2O-TiO_2-SiO_2$ --, therefor.

On page 2, in Column 1, item (56), Other Publications, Line 2, delete "Pittsburg" and insert -- Pittsburgh --, therefor.

On page 2, in Column 1, item (56), Other Publications, Line 29, delete "Na2O 3SiO2" and insert -- $Na_2O \cdot 3SiO_2$ --, therefor.

On page 2, in Column 1, item (56), Other Publications, Line 30, delete "J. Am Cerom Soc," and insert -- J. Am. Ceram. Soc., --, therefor.

On page 2, in Column 1, item (56), Other Publications, Line 32, delete "SiO2" and insert -- $SiO_2$ --, therefor.

On page 2, in Column 2, item (56), Other Publications, Line 10, delete "SiO2" and insert -- $SiO_2$ --, therefor.

On page 2, in Column 2, item (56), Other Publications, Line 30, delete "Al2O3-SiO2" and insert -- $Al_2O_3-SiO_2$ --, therefor.

On page 2, in Column 2, item (56), Other Publications, Line 32, delete "54Al2O3-46Ta2O5" and insert -- $54Al_2O_3-46Ta_2O_5$ --, therefor.

On page 2, in Column 2, item (56), Other Publications, Line 48, delete "B2O3" and insert -- $B_2O_3$ --, therefor.

Signed and Sealed this
Nineteenth Day of April, 2022

*Katherine Kelly Vidal*
*Director of the United States Patent and Trademark Office*